US012738210B2

(12) United States Patent
Hsieh et al.

(10) Patent No.: US 12,738,210 B2
(45) Date of Patent: Sep. 15, 2026

(54) ELECTRONIC DEVICE

(71) Applicant: InnoLux Corporation, Miao-Li County (TW)

(72) Inventors: Hong-Sheng Hsieh, Miao-Li County (TW); Chia-Hsien Hsieh, Miao-Li County (TW); Chih-Yung Hsieh, Miao-Li County (TW); Hsuan-Ting Kuo, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 48 days.

(21) Appl. No.: 18/784,834

(22) Filed: Jul. 25, 2024

(65) Prior Publication Data

US 2025/0069545 A1 Feb. 27, 2025

Related U.S. Application Data

(60) Provisional application No. 63/533,913, filed on Aug. 22, 2023.

(30) Foreign Application Priority Data

May 24, 2024 (CN) ......................... 202410649265.8

(51) Int. Cl.
*G09G 3/3208* (2016.01)
*G02F 1/1335* (2006.01)
(Continued)

(52) U.S. Cl.
CPC ......... *G09G 3/3208* (2013.01); *G09G 3/2007* (2013.01); *G02F 1/133528* (2013.01);
(Continued)

(58) Field of Classification Search
CPC ...... G09G 3/3208; G09G 3/2007; G09G 3/36; G09G 2320/02; G09G 2320/068;
(Continued)

(56) References Cited

U.S. PATENT DOCUMENTS

2007/0018585 A1 1/2007 Ijzerman
2010/0214324 A1* 8/2010 Broughton ............. G09G 3/003 345/60

(Continued)

FOREIGN PATENT DOCUMENTS

CN 100555373 C 10/2009
CN 106297626 A 1/2017

*Primary Examiner* — Antonio Xavier
(74) *Attorney, Agent, or Firm* — Winston Hsu

(57) ABSTRACT

The present disclosure provides an electronic device including a display and a light-adjustable control panel including a plurality of light control units. The light-adjustable control panel includes a first substrate, a second substrate, and a display medium sandwiched between the first substrate and the second substrate. In a first displaying mode, the light control units form a plurality of first transparent regions and a plurality of non-transparent regions alternately arranged, and in a second displaying mode, the control units form a second transparent region. A ratio of a total area of the first transparent regions to a total area of the light control units is different from a ratio of an area of the second transparent region to the total area of the light control units.

20 Claims, 13 Drawing Sheets

(51) Int. Cl.

| | |
|---|---|
| ***G09G 3/20*** | (2006.01) |
| ***G09G 3/36*** | (2006.01) |
| ***H10K 59/80*** | (2023.01) |
| *G02F 1/13363* | (2006.01) |
| *H10W 90/00* | (2026.01) |

(52) U.S. Cl.

CPC .... *G02F 1/133638* (2021.01); *G02F 2203/30* (2013.01); *G09G 3/36* (2013.01); *G09G 2320/02* (2013.01); *G09G 2320/068* (2013.01); *G09G 2340/0407* (2013.01); *G09G 2358/00* (2013.01); *H10K 59/8793* (2023.02); *H10W 90/00* (2026.01)

(58) Field of Classification Search

CPC ........ G09G 2340/0407; G09G 2358/00; G02F 1/133528; G02F 1/133638; G02F 2203/30; G02F 1/1335; G02F 1/1323; G02F 1/133512; H01L 25/13; H10K 59/8793; H10K 59/50

See application file for complete search history.

(56) References Cited

U.S. PATENT DOCUMENTS

2012/0280895 A1* 11/2012 Yeh .................. G02F 1/133371 345/87
2013/0120466 A1* 5/2013 Chen .................. G09G 3/3648 345/32
2016/0379394 A1 12/2016 Kim
2018/0052263 A1* 2/2018 Chen ...................... G02B 5/23
2020/0371386 A1* 11/2020 Liou ................ G02F 1/133603
2021/0109388 A1* 4/2021 You .................... G02F 1/13306

* cited by examiner

ELECTRONIC DEVICE

CROSS REFERENCE TO RELATED APPLICATION

This application claims the benefit of U.S. Provisional Application No. 63/533,913, filed on Aug. 22, 2023. The content of the application is incorporated herein by reference.

BACKGROUND OF THE DISCLOSURE

1. Field of the Disclosure

The present disclosure relates to an electronic device and particularly to an electronic device with an anti-peeping function or a mode switching function.

2. Description of the Prior Art

With the development of technology, the protection for private data is more and more important. Hence, there are more and more applications of display with needs for the anti-peeping function, for example, automated teller machine (ATM), mobile phone, notebook computer, etc. The current method for anti-peeping is to attach the light control film (LCF) to the display, so that light with large emitting angle is filtered out. However, the anti-peeping angle of the light control film is fixed after manufacture, so that the anti-peeping angle cannot be adjusted, or displaying mode cannot be switched for different needs in real time, which, therefore, restrains the applications of the display.

SUMMARY OF THE DISCLOSURE

It is an objective of the present disclosure to provide an electrode device to adjust anti-peeping angle or switch displaying mode in real time.

An embodiment of the present disclosure provides an electronic device able to switch between a first displaying mode and a second displaying mode. The electronic device includes a display and a light-adjustable control panel. The light-adjustable control panel is disposed on the display and includes a plurality of light control units. And, the light-adjustable light control panel includes a first substrate, a second substrate, and a display medium. The second substrate is disposed opposite to the first substrate, and the display medium is sandwiched between the first substrate and the second substrate, wherein the plurality of light control units form a plurality of first transparent regions and a plurality of non-transparent regions alternately arranged through the display medium in the first displaying mode, and the plurality of light control units form a second transparent region through the display medium in the second displaying mode. A ratio of a total area of the plurality of the first transparent regions to a total area of the plurality of light control units is different from a ratio of an area of the second transparent region to the total area of the plurality of light control units.

In the electronic device of the present disclosure, the electronic device may be in the first displaying mode, such that by the light-adjustable control panel switching between the transparent state and the non-transparent state of different light control units, stripes with transparent and non-transparent strips alternately arranged may be formed. As an image of the display passing through the transparent strips, the image may display in a certain direction, such that a user in a certain position may see the image, and another person outside the certain position are difficult to see the image, which achieves an anti-peeping effect.

These and other objectives of the present disclosure will no doubt become obvious to those of ordinary skill in the art after reading the following detailed description of the embodiment that is illustrated in the various figures and drawings.

DETAILED DESCRIPTION

Figure 1:
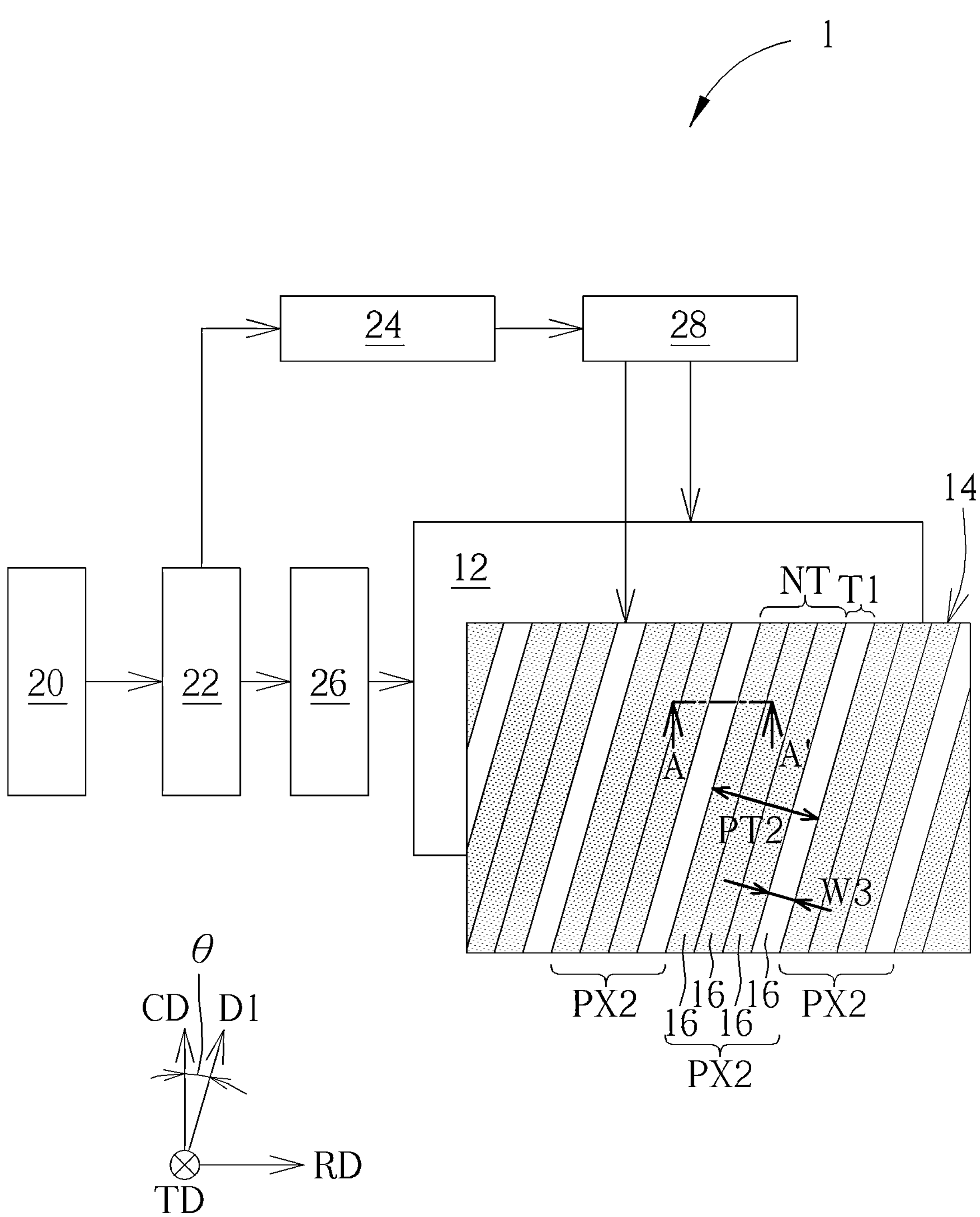
FIG. 1 schematically illustrates a block diagram of an electronic device according to a first embodiment of the present disclosure.

The contents of the present disclosure will be described in detail with reference to specific embodiments and drawings. It is noted that, for purposes of illustrative clarity and being easily understood by the readers, the following drawings may be simplified schematic diagrams, and elements therein may not be drawn to scale. The numbers and sizes of the elements in the drawings are just illustrative and are not intended to limit the scope of the present disclosure.

Certain terms are used throughout the specification and the appended claims of the present disclosure to refer to specific elements. Those skilled in the art should understand that electronic equipment manufacturers may refer to an element by different names, and this document does not intend to distinguish between elements that differ in name but not function.

In the following specification and claims, the terms "comprise", "include" and "have" are open-ended fashion, so they should be interpreted as "including but not limited to . . . ".

The ordinal numbers used in the specification and the appended claims, such as "first", "second", etc., are used to describe the elements of the claims. It does not mean that the element has any previous ordinal numbers, nor does it represent the order of a certain element and another element, or the sequence in a manufacturing method. These ordinal numbers are just used to make a claimed element with a certain name be clearly distinguishable from another claimed element with the same name.

Spatially relative terms, such as "above", "on", "beneath", "below", "under", "left", "right", "before", "front", "after", "behind" and the like, used in the following embodiments just refer to the directions in the drawings and are not intended to limit the present disclosure.

In addition, when one element or layer is "on" or "above" another element or layer or is "connected to" the another element or layer, it may be understood that the element or layer is directly on the another element or layer or directly connected to the another element or layer, and alternatively, another element or layer may be between the element or layer and the another element or layer (indirectly). On the contrary, when the element or layer is "directly on" the another element or layer or is "directly connected to" the another element or layer, it may be understood that there is no intervening element or layer between the element or layer and the another element or layer.

The term "electrically connected" includes means of direct or indirect electrical connection. Two elements electrically connected to each other may be in direct contact with each other to transfer electrical signals, and there is no other element between them. Alternatively, two elements electrically connected to each other may be bridged through another element between them to transfer electrical signals. The term "electrically connected" may also be referred to as "coupled".

As disclosed herein, the terms "approximately", "essentially", "about", or "substantially" generally mean within 20%, 10%, 5%, 3%, 2%, 1%, or 0.5% of the reported numerical value or range.

It should be understood that according to the following embodiments, features of different embodiments may be replaced, recombined or mixed to constitute other embodiments without departing from the spirit of the present disclosure. The features of various embodiments may be mixed arbitrarily and used in different embodiments without departing from the spirit of the present disclosure or conflicting.

In the present disclosure, the length, thickness, width, height, distance, and area may be measured by using an optical microscope (OM), a scanning electron microscope (SEM) or other approaches, but not limited thereto.

Unless otherwise defined, all terms (including technical and scientific terms) used herein have the same meaning as commonly understood by those skilled in the art. It should be understood that these terms, such as those defined in commonly used dictionaries, should be interpreted as having meaning consistent with the relevant technology and the background or context of the present disclosure, and should not be interpreted in an idealized or excessively formal way, unless there is a specific definition in the embodiments of the present disclosure.

An electronic device of the present disclosure may, for example, include a display device, a sensing device, an antenna device, a touch device, a tiled device or other suitable devices, but not limited thereto. The electronic device of the present disclosure may, for example, be a foldable, rollable, bendable, or flexible electronic device. The display device of the present disclosure may be any kind of display device, such as a self-luminous display device or a non-self-luminous display device. The self-luminous display device may include light emitting diodes, light conversion layers, other suitable materials, or any combination of elements mentioned above. The light emitting diode may, for example, include an organic light emitting diode (OLED), a mini light emitting diode (mini LED), a micro light emitting diode (micro LED), a quantum dot light emitting diode (e.g., QLED or QDLED), but not limited thereto. The light conversion layer may include wavelength conversion materials and/or light filtering materials. The light conversion layer may, for example, include a fluorescent material, a phosphor material, quantum dots (QDs), other suitable materials, or any combination of elements mentioned above, but not limited thereto. The sensing device may, for example, be a sensing device used for detecting variation in capacitances, light, heat, or ultrasound, but not limited thereto. The sensing device may, for example, include a biosensor, a touch sensor, a fingerprint sensor, other suitable sensors, or any combination of sensors mentioned above. The antenna device may, for example, include liquid crystal antenna or antennas of other types, but not limited thereto. The tiled device may, for example, include a tiled display device or a tiled antenna device, but not limited thereto. Furthermore, the appearance of the electronic device may be, for example, rectangular, circular, polygonal, a shape with curved edges, curved or other suitable shapes. The electronic device may have peripheral systems such as a driving system, a control system, a light source system, a shelf system, etc. The electronic device may include electronic units, in which the electronic units may include a passive element and an active element, and for example include a capacitor, a resistor, an inductor, a diode, a transistor, a sensor, etc. It is noted that the electronic device of the present disclosure may be any combination of the above-mentioned devices, but not limited thereto.

Figure 2:
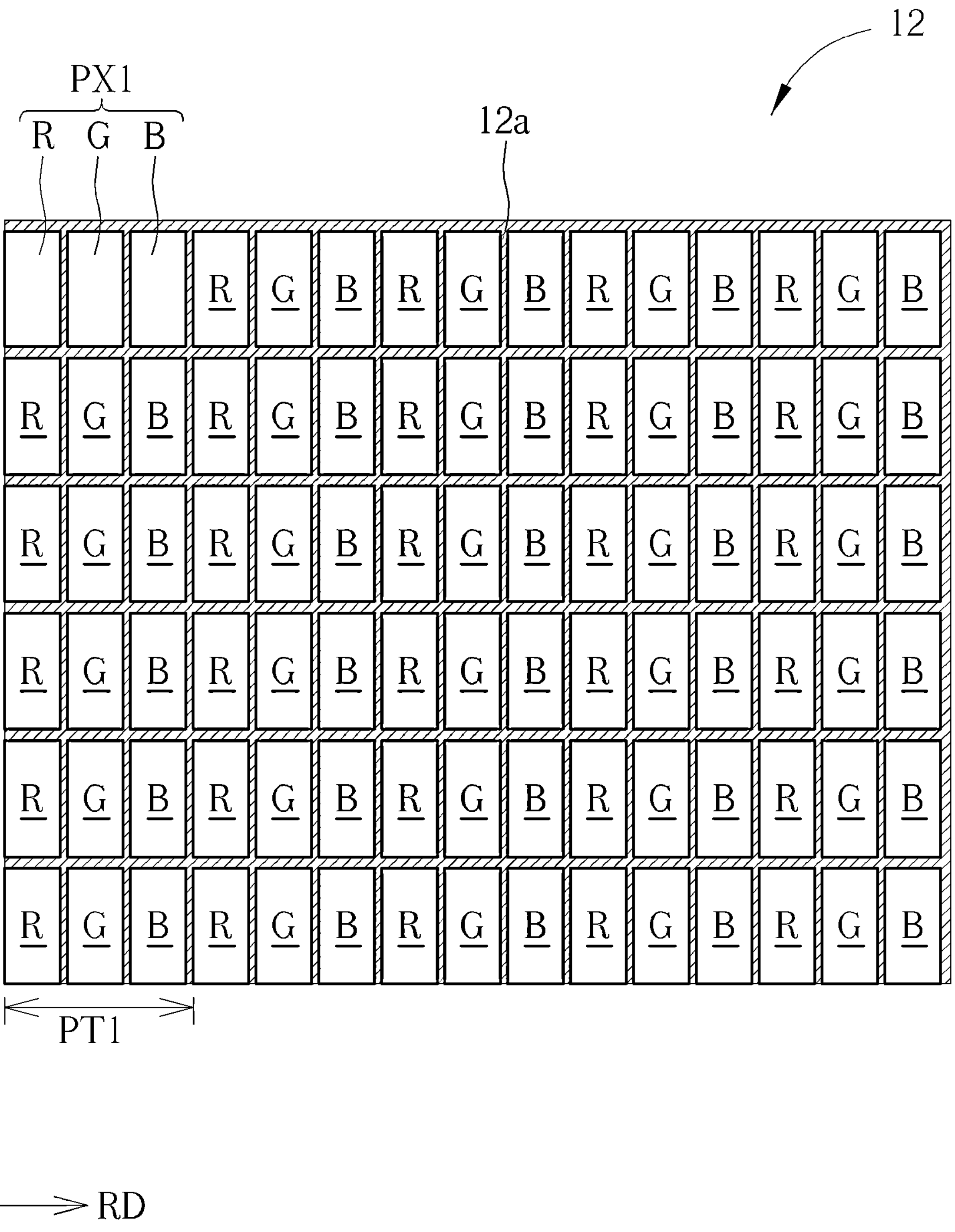
FIG. 2 schematically illustrates a top view of a display according to an embodiment of the present disclosure.
Figure 3:
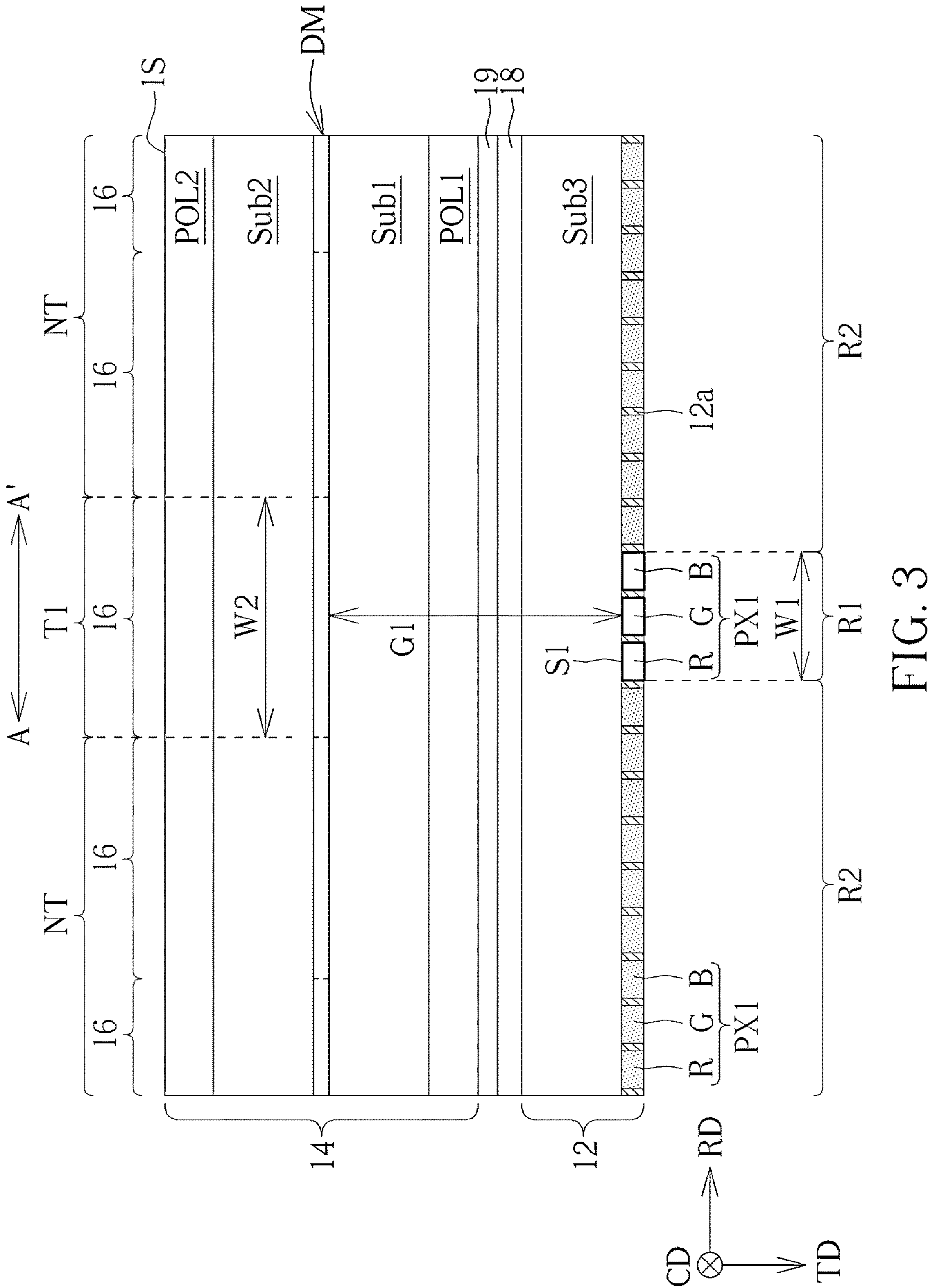
FIG. 3 schematically illustrates a cross-section view of an electronic device in a first displaying mode taken along a line A-A' in FIG. 1 according to a first embodiment of the present disclosure.
Figure 4:
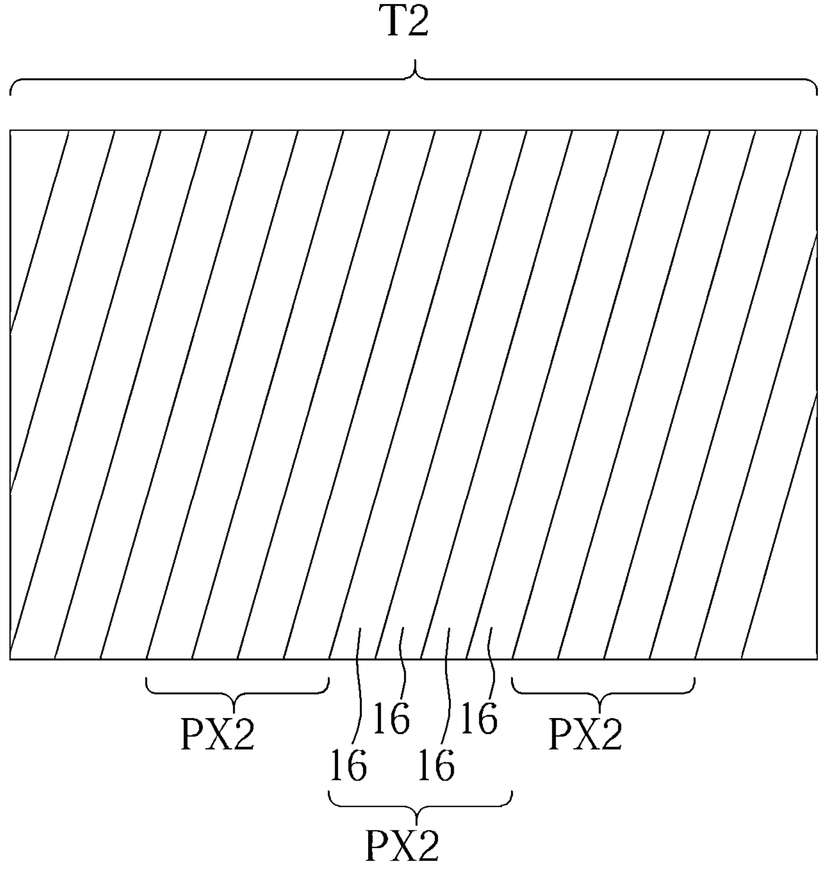
FIG. 4 schematically illustrates a top view of a light-adjustable control panel in a second displaying mode according to a first embodiment of the present disclosure.

FIG. 1 schematically illustrates a block diagram of an electronic device according to a first embodiment of the present disclosure, wherein FIG. 1 shows a top view structure of a light-adjustable control panel. FIG. 2 schematically illustrates a top view of a display according to an embodiment of the present disclosure. FIG. 3 schematically illustrates a cross-section view of the electronic device in a first displaying mode taken along a line A-A' in FIG. 1 according to the first embodiment of the present disclosure. FIG. 4 schematically illustrates a top view of the light-adjustable control panel in a second displaying mode according to the first embodiment of the present disclosure. As shown in FIG. 1 to FIG. 4, an electronic device 1 may switch between a first displaying mode and a second displaying mode, and may include a display 12 and a light-adjustable control panel 14, wherein the light-adjustable control panel 14 may be disposed on the display 12, and may include a plurality of light control units 16. The light-adjustable control panel 14 may include a first substrate Sub1, a second substrate Sub2, and a display medium DM, wherein the display medium DM is sandwiched between the first substrate Sub1 and the second substrate Sub2. For example, a material of the first substrate Sub1 may include glass, quartz, sapphire, ceramic, polycarbonate (PC), polyimide (PI), polyethylene terephthalate (PET), other suitable materials for substrate, or any combination of the above-mentioned materials. The display medium DM may, for example, include liquid crystal material or other suitable materials. As the electronic device 1 is in the first displaying mode, the light control units 16 may form a plurality of first transparent regions T1 and a plurality of non-transparent regions NT alternately arranged through the display medium DM. As the electronic device 1 is in the second displaying mode, the light control units 16 form a second transparent region T2 through the display medium DM. In addition, a ratio of a total area of the first transparent regions T1 to a total area of the light control units 16 is different from a ratio of an area of the second transparent region T2 to the total area of the light control units 16.

It should be noted that, in the first displaying mode, by an alternate arrangement of the first transparent regions T1 and non-transparent regions NT formed by the light control units 16, stripes with transparent strips and non-transparent strips alternately arranged may be formed. As an image of the display 12 passes through the first transparent regions T1, the image may be displayed in a certain direction, such that a user in a certain position may see the image while another person outside the certain position may not see the image, which achieves an anti-peeping effect. In the second displaying mode, the light control units 16 may form the second transparent region T2, but may not form the non-transparent regions NT. Hence, light generated by the display 12 may have a larger light emitting angle after passing through the second transparent region T2, which may enhance a range of a viewing angle to see the image. It can be inferred that the electronic device 1 may be in the first displaying mode with needs for anti-peeping while the electronic device 1 may be in the second displaying mode with no needs for anti-peeping to display a higher resolution image. That is, the electronic device 1 may switch between displaying modes based on different needs in real time. Furthermore, by switching the light control units 16, the light-adjustable control panel 14 may present different numbers and arrangements of the first transparent regions T1 and the non-transparent regions NT. Consequently, the images of the display 12 may have different anti-peeping angles, or the display may display different images in different angles, which achieves an effect of adjusting the anti-peeping angle, changing the viewing angle, or switching the displaying mode based on different needs.

The electronic device 1 of this embodiment will be further detailed in the following content. As shown in FIG. 2, the display 12 may include a plurality of pixels PX1. The pixels PX1 may be arranged in array or other suitable methods. Each of the pixels PX1 may, for example, include a sub-pixel R, a sub-pixel G, and a sub-pixel B generating different colors of light, which, for example, may respectively be red, green, and blue light or any combination of other colors of light. In the embodiment of FIG. 2, the display 12 may be a self-luminous display, for example, a micro-LED display, an OLED display, or other suitable displays. In other words, each of the sub-pixel R, the sub-pixel G, and the sub-pixel B of the same pixel PX1 may include a light emitting element that generates light. The sub-pixel R, the sub-pixel G, and the sub-pixel B may, for example, be constituted by the light emitting elements with different colors, or may include the light emitting elements with different colors and color filters with different colors. The light emitting elements may, for example, include a red light emitting element, a green light emitting element, and a blue light emitting element. In some embodiments, each of the sub-pixel R, the sub-pixel G, and the sub-pixel B may include a light emitting element and a light conversion layer. Under this circumstance, the light emitting elements may generate light with a same color, and the light conversion layers of the sub-pixel R, the sub-pixel G, and the sub-pixel B may produce light with different colors, but not limited thereto. For example, the light emitting element may include the blue light emitting element, and the light conversion layer may include a quantum dot layer. In some embodiments, the light conversion layer of each of the sub-pixel R, the sub-pixel G, and the sub-pixel B may include the quantum dot layer and a color filter sequentially disposed on the light emitting element. Or, the light emitting element may include the blue light emitting element and yellow phosphor powder, and the light conversion layer may include the color filter, but the present disclosure is not limited thereto. In some embodiments, the display 12 may be a non-self-luminous display, for example, a liquid crystal display or other suitable displays.

As shown in FIG. 2, each of the pixels PX1 may have a pitch PT1, which may, for example, be greater than or equal to 60 micrometers (μm) and less than or equal to 260 μm, which means 60 μm the pitch PT1≤260 μm. The pitch PT1 may, for example, be 105 micrometers. The pitch PT1 may, for example, be a distance between a left side (or right side) of the sub-pixel R (it may as well be the sub-pixel G or the sub-pixel B) producing a color of a pixel PX1 and a left side (or right side) of the sub-pixel R (it may as well be the sub-pixel G or the sub-pixel B) producing the same color of another pixel PX1 adjacent to the pixel PX1.

It should be pointed out that, in the present disclosure, as shown in FIG. 3, light emitting surfaces S1 of the sub-pixel R, the sub-pixel G, and the sub-pixel B may be respectively defined as light exiting surfaces of elements generating light with different colors. For example, as light generated by the light emitting element is taken as light of the sub-pixel R (it may as well be the sub-pixel G or the sub-pixel B), the light exiting surface of the light emitting element may be the light emitting surface S1 of the sub-pixel R (it may as well be the sub-pixel G or the sub-pixel B). Or, as light generated by the light conversion layer or light emitted from the color filter is taken as the light of the sub-pixel R (it may as well be the sub-pixel G or the sub-pixel B), a light exiting surface of the light conversion layer or the color filter may be taken as the light emitting surface S1 of the sub-pixel R (it may as well be the sub-pixel G or the sub-pixel B), but not limited thereto. In some embodiments, the light conversion layer may include phosphor material, fluorescent material, quantum dot particles, color filtering material, or other suitable materials.

As shown in FIG. 3, as the electronic device 1 is in the first displaying mode, a plurality of the pixels PX1 may be turned on to generate light, such that these pixels PX1 may form or include a plurality of first display regions R1, wherein the first display regions R1 may respectively be overlapped with the corresponding transparent regions T1, and rest of the pixels PX1 may form or include dark regions R2. Although FIG. 3 illustrates one of the first display regions R1, the present disclosure is not limited thereto. The dark regions R2 may, for example, be regions where the pixels PX1 are turned off, but not limited thereto. In the embodiment of FIG. 3, one or more pixels PX1 may form one of the first display regions R1, but not limited thereto. A width W1 of the first display region R1 in a row direction RD of the pixels PX1, or the pitch PT1 of the pixel PX1 shown in FIG. 2, may be less than or equal to a width W2 of the first transparent region T1 in the row direction RD, such that the user may clearly see the image displayed by the first display regions R1. For example, the width W1 of the first display region R1 in the row direction RD of the pixels PX1 may substantially be 60% of the width W2 of the first transparent region T1 in the row direction RD to reduce color deviation of the image seen by the user. For example, as the pitch PT1 of the pixel PX1 is 105 micrometers, the width W2 may be 175 micrometers. In the embodiment of FIG. 3, the first display region R1 may be fully overlapped with the first transparent region T1 in a top view direction TD, such that the user may see the image displayed by the first display regions R1 in the top view direction TD, but not limited thereto. In some embodiments, a position of the user's eye may be detected by an eye tracking sensor, and a position of the first display region R1 may then be moved or adjusted according to the position of the user's eye. In some embodiments, based on other requirements, the width W1 of the first display region R1 in the row direction RD of the pixels PX1, or the pitch PT1 of the pixel PX1 shown in FIG. 2, may be greater than the width W2 of the first transparent region T1 in the row direction RD. In the present disclosure, the top view direction TD may, for example, be parallel to a normal direction of the first substrate Sub1.

In the embodiment of FIG. 2 and FIG. 3, the display 12 may further include a light shielding pattern **12*a* disposed between any two neighboring sub-pixels of the sub-pixel R, the sub-pixel G, and the sub-pixel B, wherein the light shielding pattern 12*a* may be used to reduce or avoid light of the sub-pixel R, the sub-pixel G, and the sub-pixel B mixing with each other before being emitted from the light emitting surface S1**, such that color saturations of the sub-pixel R, the sub-pixel G, and the sub-pixel B may be enhanced.

As shown in FIG. 3, the display 12 may optionally include a third substrate Sub3 disposed between the pixels PX1 and the light-adjustable control panel 14 to, for example, protect the pixels PX1. The electronic device 1 may further include an adhesive layer 18 to attach the light-adjustable control panel 14 to an upper surface of the display 12. A material of the third substrate Sub3 may be similar or identical to the material of the first substrate Sub1. Hence, here will be no further description. The adhesive layer 18 may include resin, optically clear adhesive (OCA), pressure sensitive adhesive (PSA), or other suitable adhesive materials.

Besides, as shown in FIG. 1, viewed along the top view direction TD of the electronic device 1, the light control units 16 may be in a shape of strip and extend in a direction Dl. An angle θ between the extending direction Dl of the light control units 16 and a column direction CD of the pixels PX1 may, for example, be greater than or equal to 5 degrees and less than or equal to 30 degrees, which is 5°≤the angle θ≤30°. By designs of the angle θ, moiré fringes produced by the strip-shaped first transparent regions T1 formed by the light control units 16 interfering with the image displayed by the display 12 may be reduced or avoided.

As shown in FIG. 3, each of the light control units 16 may include a part of the display medium DM. Through controlling a state of the part of the display medium DM, the corresponding light control units 16 may be represented as transparent or non-transparent, such that the first transparent regions T1 and non-transparent regions NT shown in FIG. 1 or the second transparent region T2 shown in FIG. 4 may be formed. For example, the light-adjustable control panel 14 may include a twisted nematic (TN) liquid crystal panel, a vertical alignment (VA) liquid crystal panel, an in-plane switching (IPS) liquid crystal panel, or other suitable types of liquid crystal panels. Taking TN liquid crystal panel for example, each of the light control units 16 may further include a pixel electrode and a common electrode respectively disposed on upper and lower sides of the display medium DM to control the state of the part of the display medium DM corresponding to the light control unit 16, but not limited thereto. A shape of the pixel electrode may be strip, such that a shape of the light control unit 16 may also be strip. Consequently, a transparent state or a non-transparent state of each of the light control units 16 may respectively form a strip-shaped transparent region and a strip-shaped non-transparent region. The display medium DM may, for example, include liquid crystal molecules or other suitable display media. Types of the liquid crystal molecules may be adjusted according to types of the light-adjustable control panel 14. In some embodiments, relative structure among the pixel electrode, the common electrode, and the display medium DM may be adjusted according to the types of the light-adjustable control panel 14. For example, the pixel electrode and the common electrode may be disposed on the same side of the display medium DM.

As shown in FIG. 1 and FIG. 3, the light control units 16 may be grouped into a plurality of groups PX2 sequentially arranged, such that as the electronic device 1 is in the first displaying mode, each of the groups PX2 may form a corresponding one of the first transparent regions T1 and corresponding one or two of the non-transparent regions NT in a same frame time, which results in alternate arrangement of the first transparent regions T1 and non-transparent regions NT. By cooperating with the first display regions R1 and the dark regions R2 of the display 12, the electronic device 1 may have an anti-peeping function in the first displaying mode. Each of the groups PX2 may have a pitch PT2, and the pitch PT2 may be a total width of the first transparent region T1 and the non-transparent regions NT formed by the same group PX2, but not limited thereto.

As shown in FIG. 3 and FIG. 4, as the electronic device 1 is in the second displaying mode, all of the light control units 16 of each of the groups PX2 may be turned on to form or include the second transparent region T2. In this case, all of the pixels PX1 of the display 12 may be turned on, such that a resolution of the displayed image in this mode may be higher than a resolution of the displayed image in the first displaying mode. It is noted that a brightness of a maximum gray scale value of each of the pixels PX1 in the second displaying mode may, for example, be in a range of 12% to 60% of a brightness of a maximum gray scale value of each of the pixels PX1 in the first displaying mode. Hence, a visual difference (e.g., visible brightness) between the first displaying mode and the second displaying mode may be reduced, which reduces discomfort from switching modes, enhancing the user experience.

As shown in FIG. 1, a ratio of an area of one of the first transparent regions T1 to a total area of one of the first transparent regions T1 and one of the non-transparent regions NT (or a ratio of a width W3 of the first transparent region T1 in an arranging direction of the light control units 16 to the pitch PT2 of the groups PX2) may be greater than or equal to 14% and less than or equal to 50%, that is, 14%≤the ratio≤50%, such that light from one of the first display regions R1 may emit through one corresponding first transparent region T1, and may not easily emit through the other first transparent regions T1. In the embodiment of FIG. 1, each of the groups PX2 may include adjacent four of the light control units 16, wherein one of the light control units 16 may form the first transparent region T1, and other three of the light control units 16 may form one non-transparent region NT, but not limited thereto. In this case, the ratio of the area of the first transparent regions T1 to the total area of one of the first transparent regions T1 and one of the non-transparent regions NT may be greater than or equal to 14% and less than or equal to 35%. The ratio in FIG. 1 may, for example, be 25%, but not limited thereto. In some embodiments, each of the groups PX2 may include two, three, or five or more light control units 16. Or, under the condition that complies with the above-mentioned ratio range, in the same group PX2, at least two of the light control units 16 may form one first transparent region T1 while rest of the light control units 16 form the non-transparent region NT, but not limited thereto.

In some embodiments, as shown in FIG. 1 and FIG. 3, in a cross-section view, an angle between a connecting line of a center of the first display region R1 and a center of the first transparent region T1 formed by one of the groups PX2 and a connecting line of the center of the first display region R1 and a center of the light control unit 16 of the same group PX2 furthest away from the first transparent region T1 may, for example, be greater than or equal to 30 degrees and less than or equal to 45 degrees, which is 30° the angle 45°. Under this circumstance, a light emitting angle of light generated by one of the pixels PX1 corresponding to one of the first transparent regions T1 emitted toward another one of the first transparent regions T1 neighboring the one of the first transparent regions T1 and emitted out from a display surface 1S of the electronic display 1 may be greater than a certain value. Hence, the light is prone to be total reflected but is not easy to be emitted out from the neighboring first transparent region T1, which reduces a light leakage of the image. Furthermore, in the electronic device 1, a number of the first display regions R1 used to display the image may not be too less, such that the image may be maintained to be displayed with a certain resolution. For example, a ratio of a number of a part of the light control units 16 forming the first transparent regions T1 to a number of another part of the light control units 16 forming the non-transparent regions NT may be greater than or equal to ⅕ and less than or equal to ⅓, which is ⅕≤the ratio≤⅓. Or, in some embodiments, a ratio of the pitch PT2 to a distance G1 between the light emitting surface S1 of the sub-pixel R (it may as well be the sub-pixel G or the sub-pixel B) and the display medium DM may be greater than or equal to 0.5 and less than or equal to 2.

As shown in FIG. 3, the light-adjustable control panel may further include a first polarizer POL1 and a second polarizer POL2, wherein the first polarizer POL1 is disposed on a surface of the first substrate Sub1 away from the display medium DM, and the second polarizer POL2 is disposed on a surface of the second substrate Sub2 away from the display medium DM. A polarization direction of the first polarizer POL1 may, for example, be perpendicular or parallel to a polarization direction of the second polarizer POL2. Each of the light control units 16 may include a corresponding part of the first substrate Sub1, a corresponding part of the second substrate Sub2, a corresponding part of the display medium DM, a corresponding part of the first polarizer POL1, and a corresponding part of the second polarizer POL2, but not limited thereto. By adjusting an oriented direction of the corresponding part of the display medium DM, the transparent state and the non-transparent state of each of the light control units 16 may be switched.

In some embodiments, the electronic device 1 may optionally further include a quarter wave plate 19 disposed between the display 12 and the light-adjustable control panel 14. Since the quarter wave plate 19 may retard a quarter wavelength phase to light, an ambient light emitted into an upper surface of the light-adjustable control panel 14 may not be emitted out from the upper surface of the light-adjustable control panel 14 after passing through the light-adjustable control panel 14 and the quarter wave plat 19, which achieves an anti-reflection effect, minimizing an effect of the ambient light on the displayed image. The distance G1 may be the distance between the light emitting surface S1 and the display medium DM. In another words, in the embodiment of FIG. 3, the distance G1 may be a total thickness of the third substrate Sub3, the adhesive layer 18, the quarter wave plate 19, the first polarizer POL1, and the first substrate Sub1, but not limited thereto.

In the embodiment of FIG. 1, the electronic device 1 may further include an input unit 20, a timing controller 22, a signal processor 24, a gate driving circuit 26, and a data driving circuit 28, wherein the input unit 20 is electrically connected to the timing controller 22 to transmit a video signal or image signal to the timing controller 22, the timing controller 22 is electrically connected to the signal processor 24 and the gate driving circuit 26 to match a timing of the signal processor 24 and a timing of the gate driving circuit 26. The signal processor 24 may be electrically connected between the timing controller 22 and the data driving circuit 28, and the data driving circuit 28 may further be electrically connected to the display 12 and the light-adjustable control panel 14. The signal processor 24 may process data for being inputted to the display 12, and then, may transmit processed signal to the data driving circuit 28, and the data driving circuit 28 may further convert the processed signal into a voltage signal used for displaying the image and a voltage signal used for switching the states of the light control units 16. The gate driving circuit 26 may be electrically connected between the timing controller 22 and the display 12, and the voltage signal generated by the data driving circuit 28 and used for switching the light control units 16 may be matched up with the timing of the gate driving circuit 26 to be transmitted to the display 12, such that the display 12 may display the image. Furthermore, the voltage signal generated by the data driving circuit 28 and used for switching the states of the light control units 16 may be matched up with a timing of the voltage signal used for displaying the image to be transmitted to the light-adjustable control panel 14, such that a forming time of the first transparent region T1 may match a turning-on time of the corresponding first display region R1. In another words, the display 12 and the light-adjustable control panel 14 may share the same data driving circuit 28, but not limited thereto. The signal processor 24 may, for example, include a graphics card, a CPU, a GPU, an ASIC, a system on a chip (SoC), an integrated circuit (IC), or other suitable processors.

Figure 5:
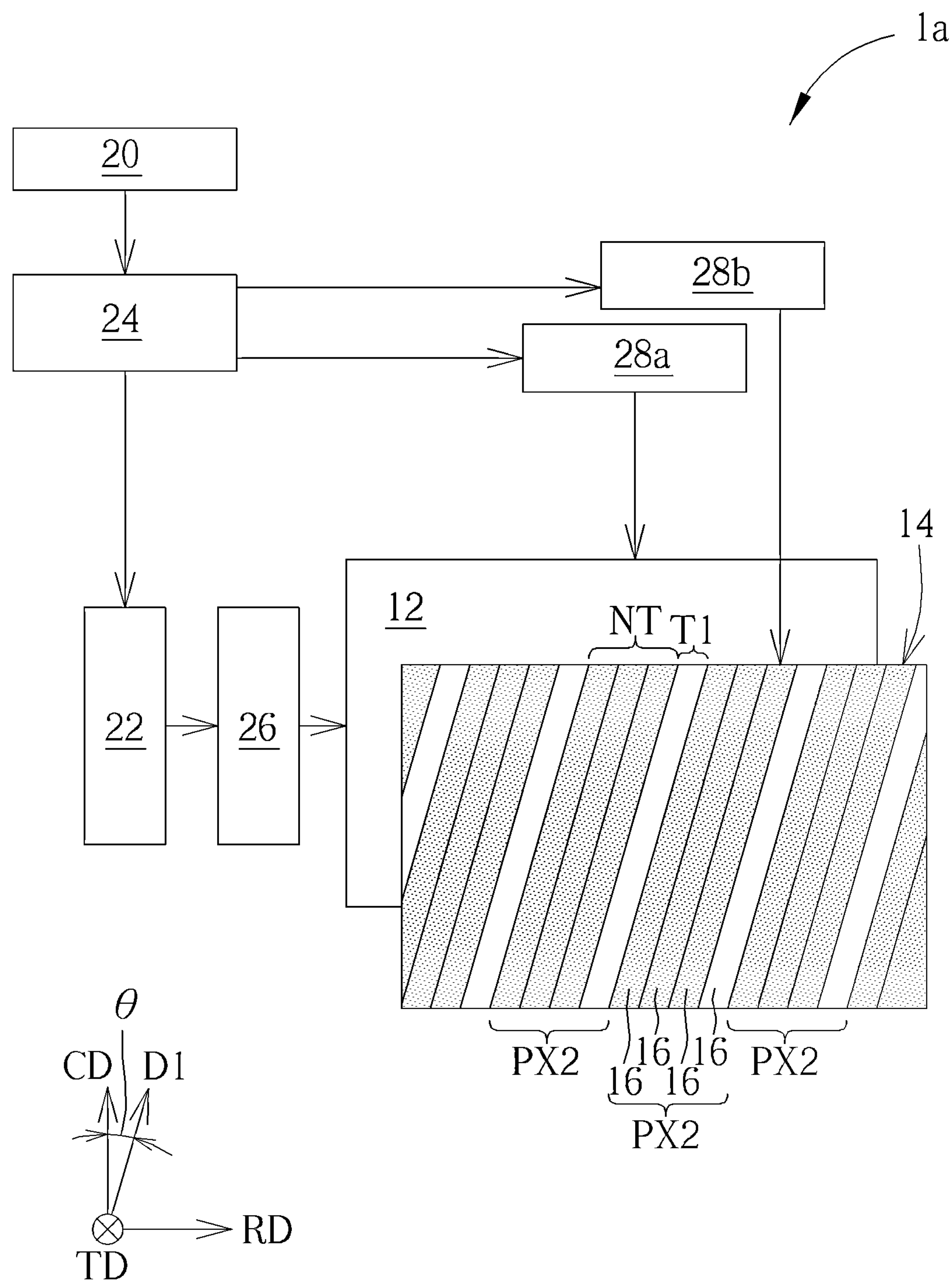
FIG. 5 schematically illustrates a circuit structure of an electronic device according to a variant embodiment of a first embodiment of the present disclosure.

Refer to FIG. 5. FIG. 5 schematically illustrates a circuit structure of an electronic device according to a variant embodiment of a first embodiment of the present disclosure. As shown in FIG. 5, an electronic device 1*a* of this embodiment differs from the electronic device 1 shown in FIG. 1 in that the electronic device 1*a* may include a first data driving circuit 28*a* and a second data driving circuit 28*b*, wherein the first data driving circuit 28*a* is electrically connected between the signal processor 24 and the display 12, and the second data driving circuit 28*b* is electrically connected between the signal processor 24 and the light-adjustable control panel 14. The first data driving unit 28*a* may generate the voltage signal for displaying the image by receiving the signal from the signal processor 24, and then, may transmit the voltage signal to the display 12. The second data driving circuit 28*b* may generate the voltage signal for switching the transparent state and the non-transparent state of the light control units 16 by receiving the signal from the signal processor 24, and then, the voltage signal may be transmitted to the light-adjustable control panel 14. In other words, the display 12 and the light-adjustable control panel 14 of this embodiment may respectively be provided with the signals by the first data driving circuit 28*a* and the second data driving circuit 28*b*, but bot limited thereto.

In some embodiments, as the signal processor 24 have enough computational power, the input unit 20 may directly be electrically connected to the signal processor 24 and be electrically connected to the timing controller 22 through the signal processor 24. Hence, the video signal may be transmitted to the signal processor 24, and the timing signal may be transmitted to the timing controller 22 through the signal processor 24, but not limited thereto. This connection method may be applied to the embodiment of FIG. 1. Other parts of the electronic device 1*a* may be similar or identical to the electronic device 1 in FIG. 1, and therefore, will not be redundantly detailed.

Figure 6:
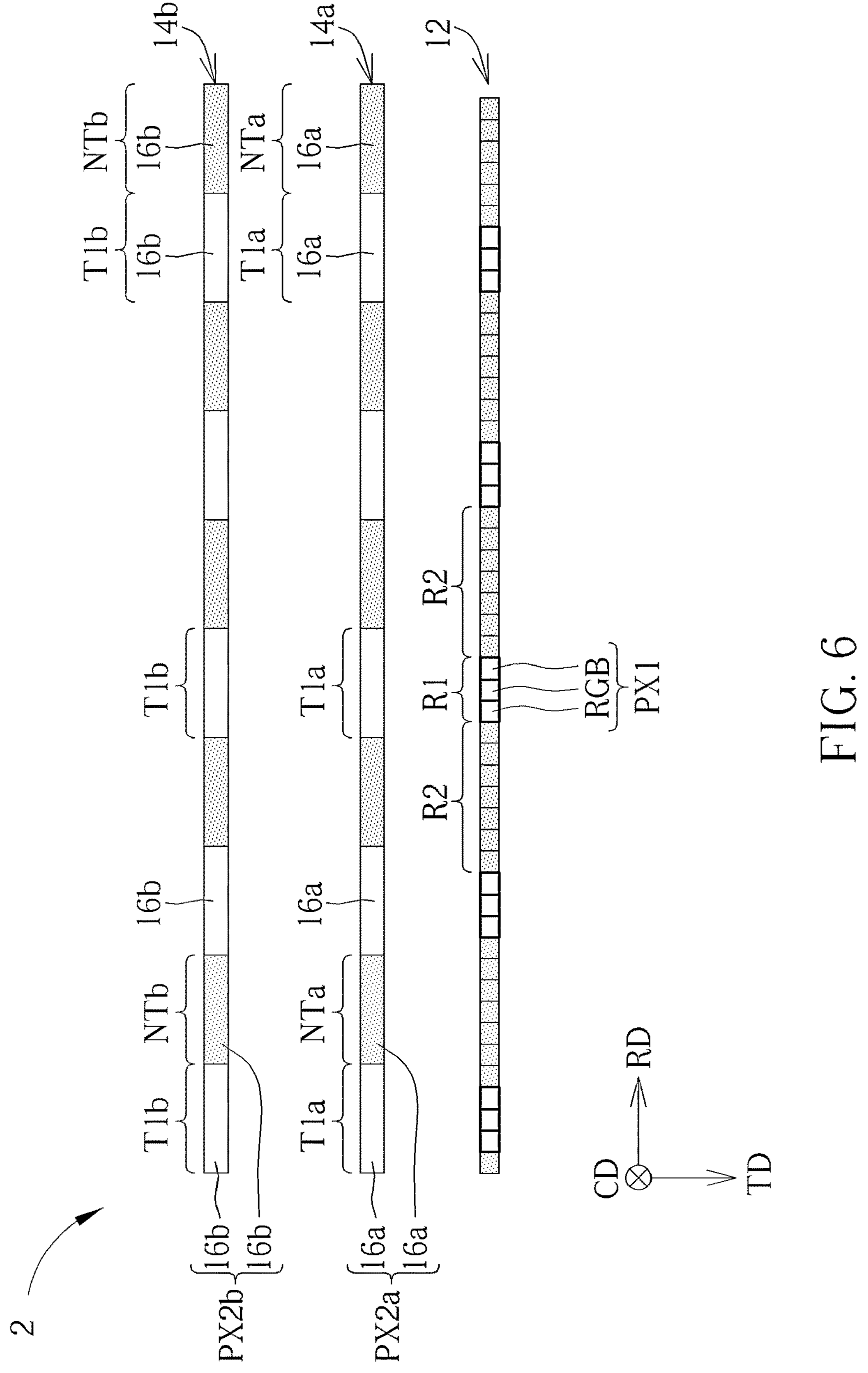
FIG. 6 schematically illustrates a cross-section view of an electronic device according to a second embodiment of the present disclosure.

Refer to FIG. 6. FIG. 6 schematically illustrates a cross-section view of an electronic device according to a second embodiment of the present disclosure, wherein for clarifying relations between the first display regions and the first transparent regions, FIG. 6 illustrates the sub-pixel R, the sub-pixel G, and the sub-pixel B of the display and the light control units of the light-adjustable control panel and neglects other elements, but the present disclosure is not limited thereto. As shown in FIG. 6, an electronic device 2 of this embodiment differs from the electronic device 1 shown in FIG. 1 in that the electronic device 2 may include a first light-adjustable control panel 14*a* and a second light-adjustable control panel 14*b* sequentially disposed on the display 12. The light control units 16*a* of the first light-adjustable control panel 14*a* may respectively correspond to and be overlapped with the light control units 16*b* of the second light-adjustable control panel 14*b* in the top view direction TD. For example, one of the first transparent regions T1*b* formed by the light control units 16*b* may be overlapped with one of the first transparent regions T1*a* formed by the light control units 16*a*, and one of the first transparent regions T1*b* and the first transparent region T1*a* may further be overlapped with one of the first display regions R1 formed by the pixels PX1. Hence, a divergent angle of light emitted from each of the first display regions R1 of the electronic device 2 to the user may be minimized, such that the viewing angle of the user watching the electronic device 2 may be reduced, which enhances an anti-peeping ability. In the embodiment of FIG. 6, the ratio of the width W1 of the first transparent region T1*a* of the light control unit 16*a* in the row direction RD to the width W2 of the first transparent region T1*b* of the light control unit 16*b* in the row direction RD may be greater than or equal to 0.9 and less than or equal to 1.1, which is 0.9≤the ratio≤1.1, but not limited thereto. Under this circumstance, the ratio of the area of the first transparent region T1*a* to the total area of one of the first transparent regions T1*a* and one of the non-transparent regions NTa and the ratio of the area of the first transparent region T1*b* to the total area of one of the first transparent regions T1*b* and one of the non-transparent regions NTb may both be greater than or equal to 25% and less than or equal to 50%, but not limited thereto.

In the embodiment of FIG. 6, the light control units 16*a* may be grouped into a plurality of groups PX2*a*, and each of the groups PX2*a* may include two of the light control units 16*a*. The light control units 16*b* may be grouped into a plurality of groups PX2*b*, and each of the groups PX2*b* may include two of the light control units 16*b*. But, a number of the light control units 16*a* in one of the groups PX2*a* and a number of the light control units 16*b* in one of the groups PX2*b* are not limited to be equal to each other and are not limited to the above-mentioned contents. Other parts of the electronic device 2 may be similar or identical to the electronic device 1 in FIG. 1, and therefore, will not be redundantly detailed.

Figure 7:
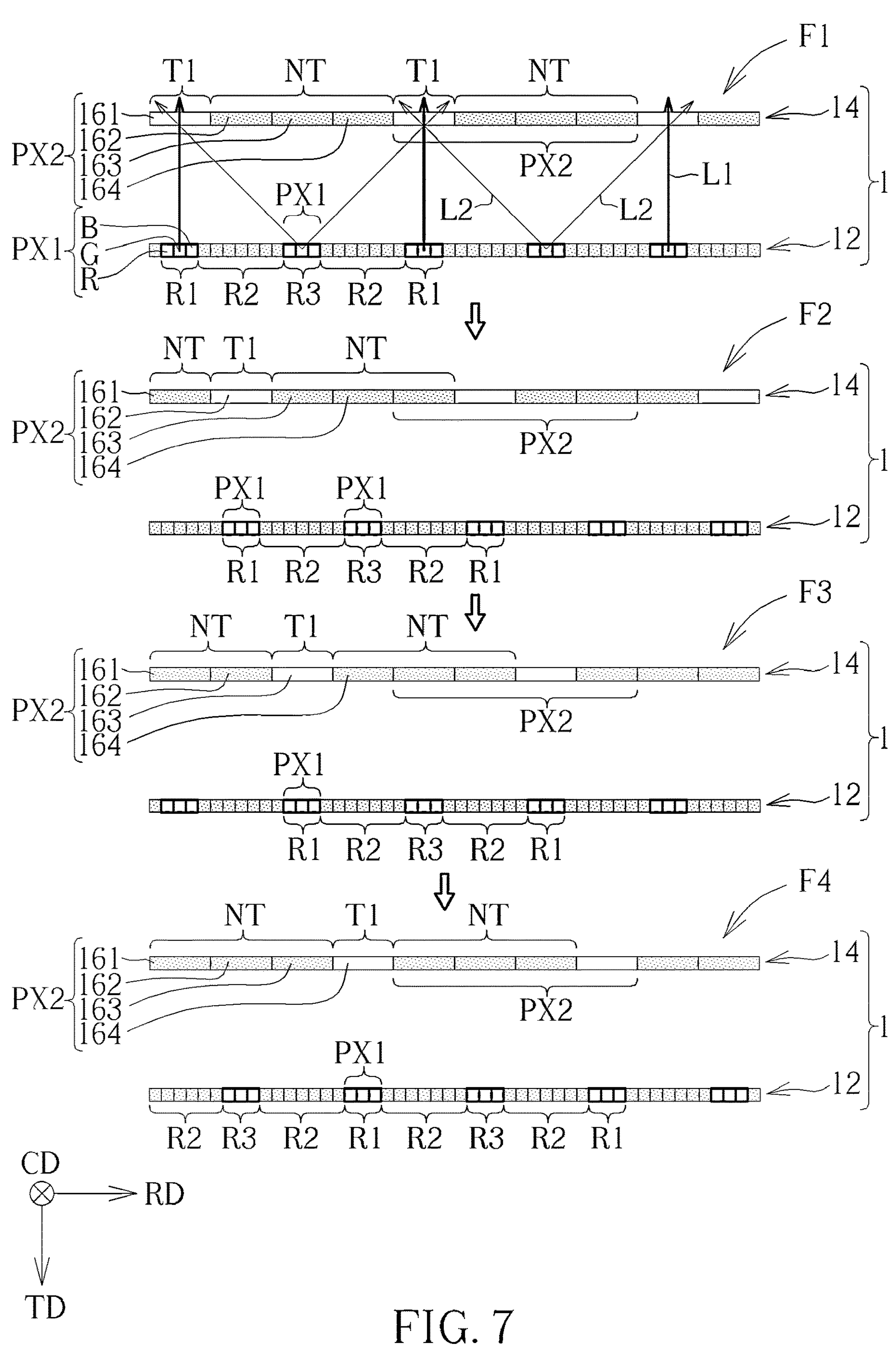
FIG. 7 schematically illustrates an operation method of an electronic device in a first displaying mode according to a third embodiment of the present disclosure.

The following content will further detail an operation method of the electronic device. Refer to FIG. 7. FIG. 7 schematically illustrates an operation method of an electronic device in the first displaying mode according to a third embodiment of the present disclosure. The electronic device of this embodiment may be one of the electronic devices of the above-mentioned embodiments, and the following content takes the electronic device 1 shown in FIG. 1 to FIG. 4 as an example, but not limited thereto. As shown in FIG. 7, the light-adjustable control panel 14 may include a plurality of groups PX2, and each of the groups PX2 may, for example, include a light control unit 161, a light control unit 162, a light control unit 163, and a light control unit 164 alternately arranged. Under the condition that the electronic device 1 is in the first displaying mode, the light control unit 161 of each of the groups PX2 may form one of the first transparent regions T1 in a first frame time F1, and the light control unit 162, the light control unit 163, and the light control unit 164 of each of the groups PX2 may form one of the non-transparent regions NT in the first frame time F1. In addition, in the first frame time F1, at least one of the pixels PX1 of the display 12 corresponding to one of the first transparent regions T1 may form a corresponding one of the first display regions R1, such that a content of the corresponding first display region R1 may be seen by the user through the first transparent region T1. For example, the first display region R1 may be overlapped with the corresponding first transparent region T1, but not limited thereto. Under this circumstance, as the user see the electronic device 1 in the top view direction TD, light L1 with the content generated by the first display region R1 may be seen.

In the first frame time F1, at least one of the pixels PX1 of the display 12 corresponding to the non-transparent region NT may further form or include a corresponding second display region R3, and the second display region R3 is not overlapped with the first transparent region T1. Furthermore, the second display region R3 may be disposed between two neighboring first display regions R1 and may be overlapped with the non-transparent region NT in the top view direction TD. For example, a distance between the second display region R3 and the neighboring first display region R1 to the left may be identical to a distance between the second display region R3 and the neighboring first display region R1 to the right, but not limited thereto. Under this circumstance, light L2 generated by the second display region R3 is emitted out of the electronic device 1 in a certain emitting angle. Therefore, the viewing angle of the user seeing the electronic device 1 may be greater than a certain value and less than a critical angle for totally reflecting the light L2. In this way, the electronic device 1 may display two independent images respectively in two ranges of viewing angle. In some embodiments, the content displayed by the first display regions R1 may be different from the content displayed by the second display regions R3.

Besides, the rest of the pixels PX1 of the display 12, which is the pixels other than the pixels PX1 forming the first display region R1 and the second display region R3, may not produce light and may be in off states, which consequently may form the dark regions R2. Each of the dark regions R2 may be disposed between a corresponding one of the first display regions R1 and a corresponding one of the second display regions R3, such that the image of the first display regions R1 may not mutually interfere with the image of the second display regions R3. In the embodiment of FIG. 7, one of the dark regions R2 may partially be overlapped with one of the first transparent regions T1 and one of the non-transparent regions NT, but not limited thereto.

As shown in FIG. 7, afterwards, in a second frame time F2, the light control unit 161 of each of the groups PX2 may be switched to the non-transparent state, such that the non-transparent region NT is formed. The light control unit 162 neighboring the light control unit 161 may be switched to the transparent state to form the first transparent region T1. Also, the light control unit 163 and the light control unit 164 still remain in the non-transparent states, such that the light control unit 163 and the light control unit 164 of one of the groups PX2 and the light control unit 161 of another group PX2 adjacent thereto may form another of the non-transparent regions NT. In the meantime, in the second frame time F2, positions of the first display regions R1 and the second display regions R3 of the display 12 may as well be synchronously adjusted with positions of the first transparent regions T1 and the non-transparent regions NT. To be specific, at least one of the pixels PX1 of the display 12 corresponding to the first transparent region T1 in the second frame time F2 may form one of the first display regions R1, such that the content of the first display region R1 may be seen by the user through the first transparent region T1. Also, at least one of the pixels PX1 of the display 12 corresponding to one of the non-transparent regions NT in the second frame time F2 may further form the second display region R3, and the pixels PX1 disposed between the first display region R1 and the second display region R3 may be in the off state to form the dark region R2. By inference, in a third frame time F3, the light control unit 163 of each of the groups PX2 may form the transparent region T1. The light control unit 161, the light control unit 162, and the light control unit 164 may form the non-transparent region NT. At least one of the pixels PX1 corresponding to the first transparent region T1 may form one of the first display regions R1, at least one of the pixels PX1 corresponding to the non-transparent region NT may form one of the second display regions R3, and the pixels PX1 disposed between the first display region R1 and the second display region R3 may be in the off states to form the dark region R2. In a fourth frame time F4, the light control unit 164 of the group PX2 may form the transparent region T1. The light control unit 161, the light control unit 162, and the light control unit 163 may form the non-transparent region NT. At least one of the pixels PX1 corresponding to the first transparent region T1 may form the first display region R1, at least one of the pixel PX1 corresponding to the non-transparent region NT may form the second display region R3, and the pixels PX1 disposed between the first display region R1 and the second display region R3 may be in the off states to form the dark region R2. After the fourth frame time F4, it may conduct in repetitive sequence of the first frame time F1, the second frame time F2, the third frame time F3, and the fourth frame time F4, such that the position of the first transparent region T1 may alter with the change of the frame times to reduce or prevent the user from seeing the stripes formed by the first transparent regions T1 and the non-transparent regions NT. In some embodiments, a frequency of changing positions of the first transparent regions T1, the first display regions R1, and the second display regions R3 may be greater than 60 Hz, for example, 200 Hz, such that the user is not prone to see the stripes. The frequency may be applied to the frequency of changing positions of the first transparent regions T1 and display regions of any one of the following embodiments. In some embodiments, the display 12 in FIG. 7 may not form the second display regions R3.

In some embodiments, a brightness of the sub-pixel of the pixels PX1 forming the first display region R1 may be higher as a distance between the sub-pixel and the dark region R2 is lower. For example, as the sub-pixel R, the sub-pixel G, and the sub-pixel B in FIG. 7 are displayed in the same gray scale value, the brightness of the sub-pixel R and the sub-pixel B may be greater than the brightness of the sub-pixel G, such that the user may see the image with uniformly brightness.

Figure 8:
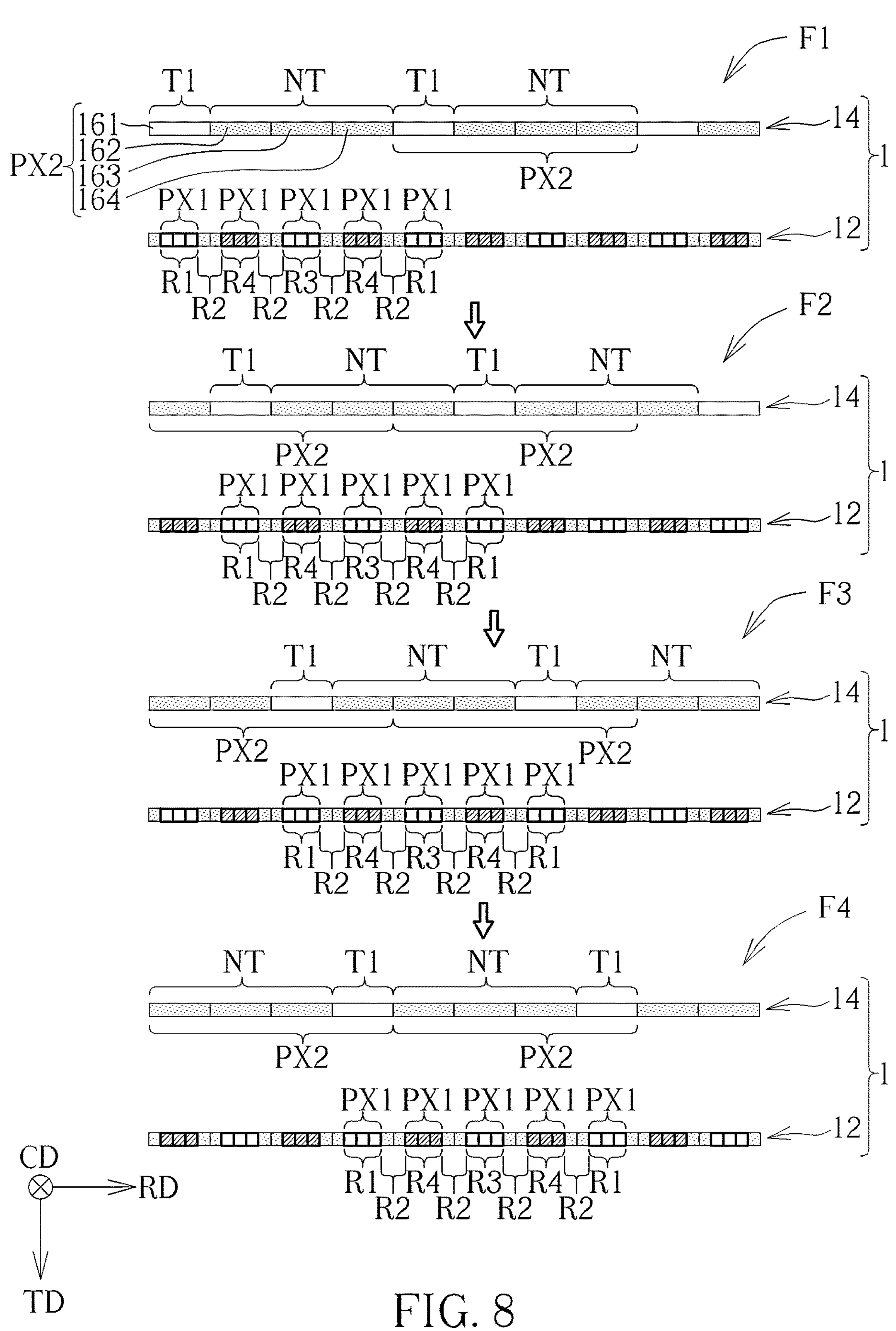
FIG. 8 schematically illustrates an operation method of an electronic device in a first displaying mode according to a fourth embodiment of the present disclosure.

Refer to FIG. 8. FIG. 8 schematically illustrates an operation method of an electronic device in a first displaying mode according to a fourth embodiment of the present disclosure. As shown in FIG. 8, the operation method of this embodiment differs from the operation method in FIG. 7 in that the pixels PX1 of the display 12 may form or include a plurality of first light adjusting regions R4, and two of the first light adjusting regions R4 respectively disposed on two sides of one of the first display regions R1 in a frame time in order to reduce or avoid the content shown by the first display regions R1 being seen by a non-user. In this embodiment, the brightness of the pixels PX1 in the first light adjusting region R4 may be a first percentage of the brightness of the maximum gray scale value of all the pixels PX1 of the display 12 in the second displaying mode minus a second percentage of the brightness of the content shown by the pixels PX1 corresponding to the first display region R1, wherein the first percentage may be in the range of 0.2% to 10%, and the second percentage may be in the range of 0.2% to 2.5%. That is, the brightness of the first light adjusting region R4 may comply with an equation: $B1=(M\times B2)-(N\times B3)$, wherein B1 is the brightness of the first light adjusting region R4, B2 is the brightness of the maximum gray scale value of the pixels PX1 of the display 12 in the second displaying mode, B3 is the brightness of the content shown by the pixels PX1 in the first display region R1, M is the first percentage, and N is the second percentage. It is noted that, although the non-transparent regions NT may be able to shield the light emitted from the first display region R1 in the large viewing angle direction, when there is no first light adjusting region R4 to produce light, the non-user may still see the light leakage of the image from the first display region R1 in a large viewing angle position (e.g., a side surface of the electronic device), such that the anti-peeping effect may not be fully achieved. By generating the above-mentioned brightness in the first light adjusting region R4, the light of the first display region R1 leaked to the large viewing angle position through the first transparent region T1 may be neutralized by the light of the first light adjusting region R4, such that the non-user may not easily or unable to see the image content displayed by the first display region R1.

In the embodiment of FIG. 8, the first light adjusting regions R4 may respectively be disposed on two sides of the corresponding one of the first display regions R1, and hence, one of the first light adjusting regions R4 may be disposed between the corresponding first display region R1 and one of the second display regions R3. In some embodiments, the pixels PX1 between the first display region R1 and the first light adjusting region R4 may further form the dark region R2, and the pixels PX1 between the second display region R3 and the first light adjusting region R4 may form the dark region R2, but not limited thereto.

In addition, as shown in FIG. 8, from the first frame time F1 to the fourth frame time F4, the light control unit 161, the light control unit 162, the light control unit 163, and the light control unit 164 of each of the groups PX2 may in sequence form the first transparent region T1, and the first display region R1, the second display region R3, the first light adjusting region R4, and the dark region R2 may be synchronously adjusted with the change of the positions of the first transparent regions T1, which is the same as the above-mentioned embodiments, and will not be detailed herein. Other parts of the operation method of FIG. 8 may be similar or identical to the embodiment of FIG. 7. Hence, here will be no further elaborations.

Figure 9:
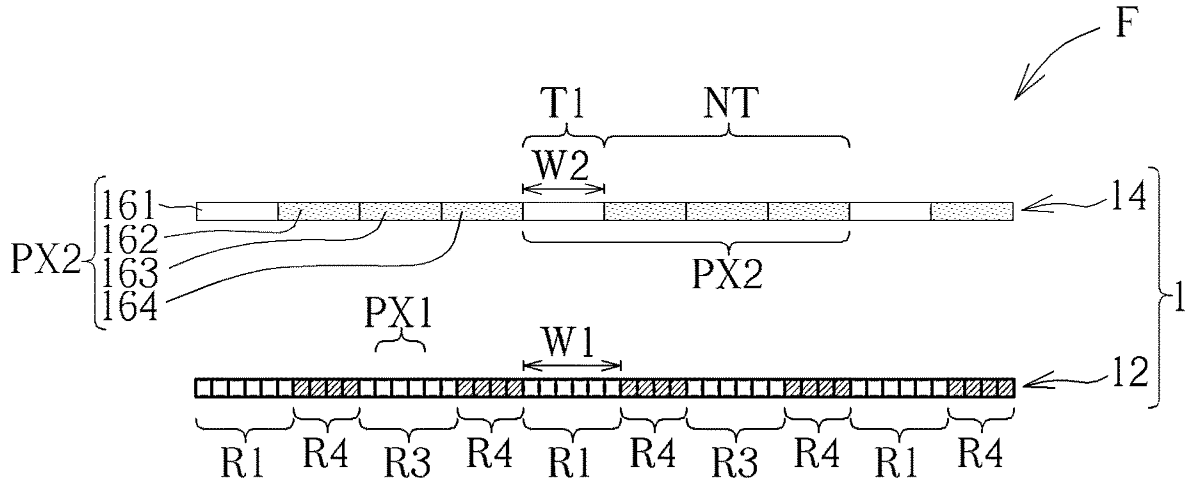
FIG. 9 schematically illustrates a cross-section view of an electronic device in a first displaying mode and in a frame time according to a fifth embodiment of the present disclosure.
Figure 9:
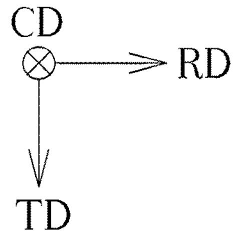

Refer to FIG. 9. FIG. 9 schematically illustrates a cross-section view of an electronic device in the first displaying mode and in a frame time according to a fifth embodiment of the present disclosure. FIG. 9 shows a frame time F, which is one of the frame times in the first displaying mode, and other frame times may be referred to the altering methods of the above-mentioned embodiments, but not limited thereto. As shown in FIG. 9, a difference between the operation method of this embodiment and the operation method of FIG. 8 is that the width W1 of the first display region R1 in the row direction RD of the pixels PX1, or the pitch PT1 of the pixel PX1 shown in FIG. 2, in may be greater than the width W2 of the first transparent region T1 in the row direction RD, such that the resolution of the image in the first displaying mode may be enhanced.

In the embodiment of FIG. 9, the first light adjusting region R4 may optionally be adjacent to the first display region R1 to enhance an ability of the first light adjusting region R4 to neutralize the light leakage of the first display region R1. The brightness of the pixel PX1 in the first light adjusting region R4 may be referred to the above-mentioned embodiments, and here will be no further elaborations. In some embodiments, the first light adjusting region R4 may optionally be next to both the first display region R1 and the second display region R3, such that each of the pixels PX1 of the display 12 may be turned on. In this case, the display 12 in the first displaying mode may not form the dark regions R2, but not limited thereto. Other parts of the operation method of FIG. 9 may be similar or identical to the embodiment of FIG. 7. Hence, here will be no further elaborations.

Figure 10:
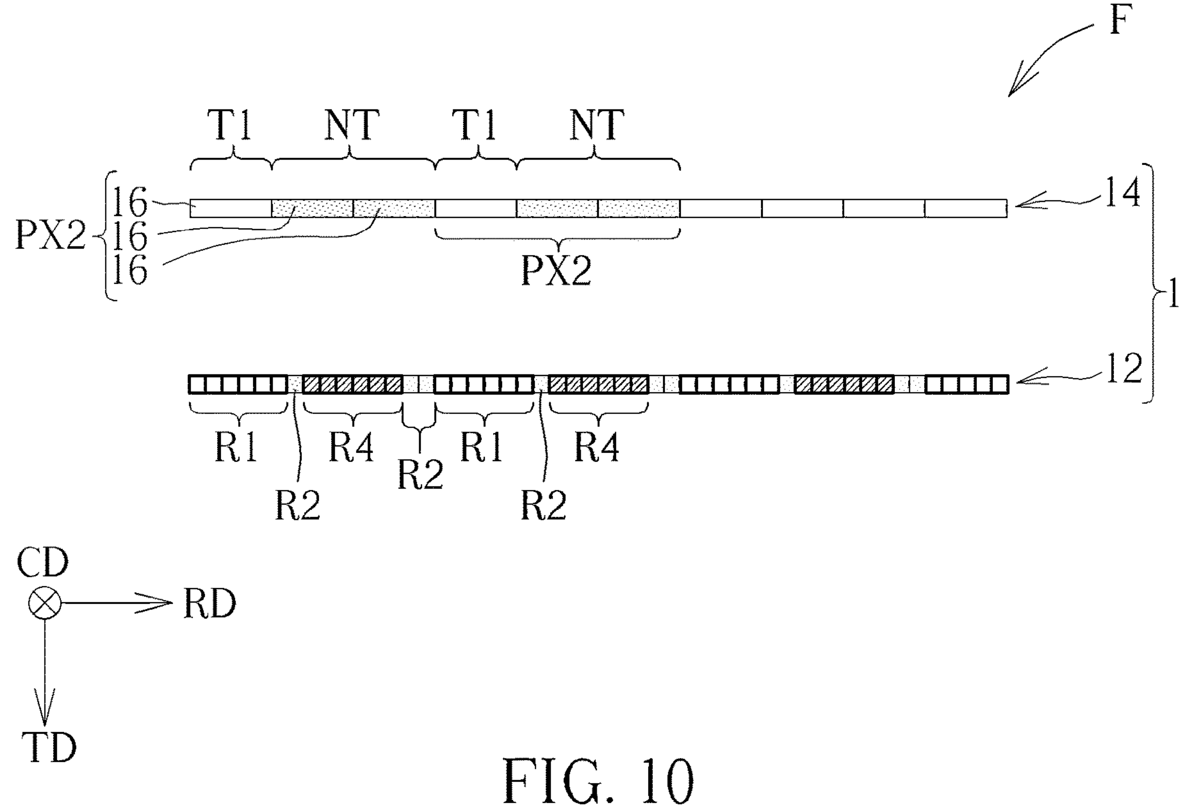
FIG. 10 schematically illustrates a cross-section view of an electronic device in a first displaying mode and in a frame time according to a sixth embodiment of the present disclosure.

Refer to FIG. 10. FIG. 10 schematically illustrates a cross-section view of an electronic device in the first displaying mode and in a frame time according to a sixth embodiment of the present disclosure. FIG. 10 shows the frame time F, which is one of the frame times, in the first displaying mode, and other frame times may be referred to the operation methods of the above-mentioned embodiments, but not limited thereto. As shown in FIG. 10, a difference between the operation method of this embodiment and the operation method of FIG. 9 is the display 12 of this embodiment may not form the second display regions R3 shown in FIG. 7. In the embodiment of FIG. 10, one of the first light adjusting regions R4 may be formed between two neighboring first display regions R1, but not limited thereto. In some embodiments, one of the dark regions R2 may optionally be formed between one of the first display regions R1 and one of the first light adjusting regions R4. In some embodiments, as shown in FIG. 10, the number of the light control units 16 of each of the groups PX2 may not be limited to four, but may be three or other suitable numbers.

Other parts of the operation method of FIG. 10 may be similar or identical to the embodiment of FIG. 7. Hence, here will be no further elaborations.

Figure 11A:
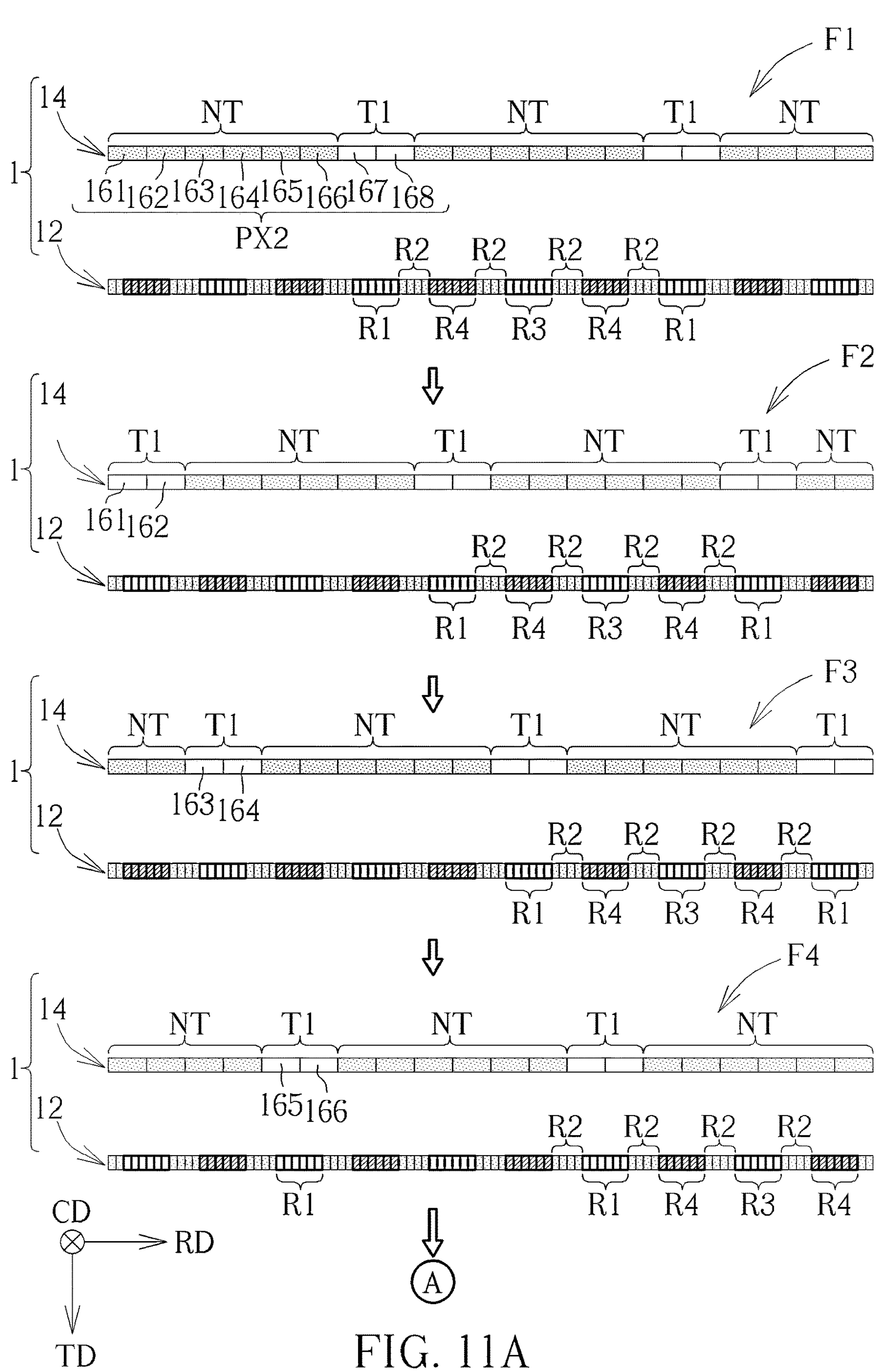
FIG. 11A and FIG. 11B schematically illustrate an operation method of an electronic device in a first displaying mode according to a seventh embodiment of the present disclosure.
Figure 11B:
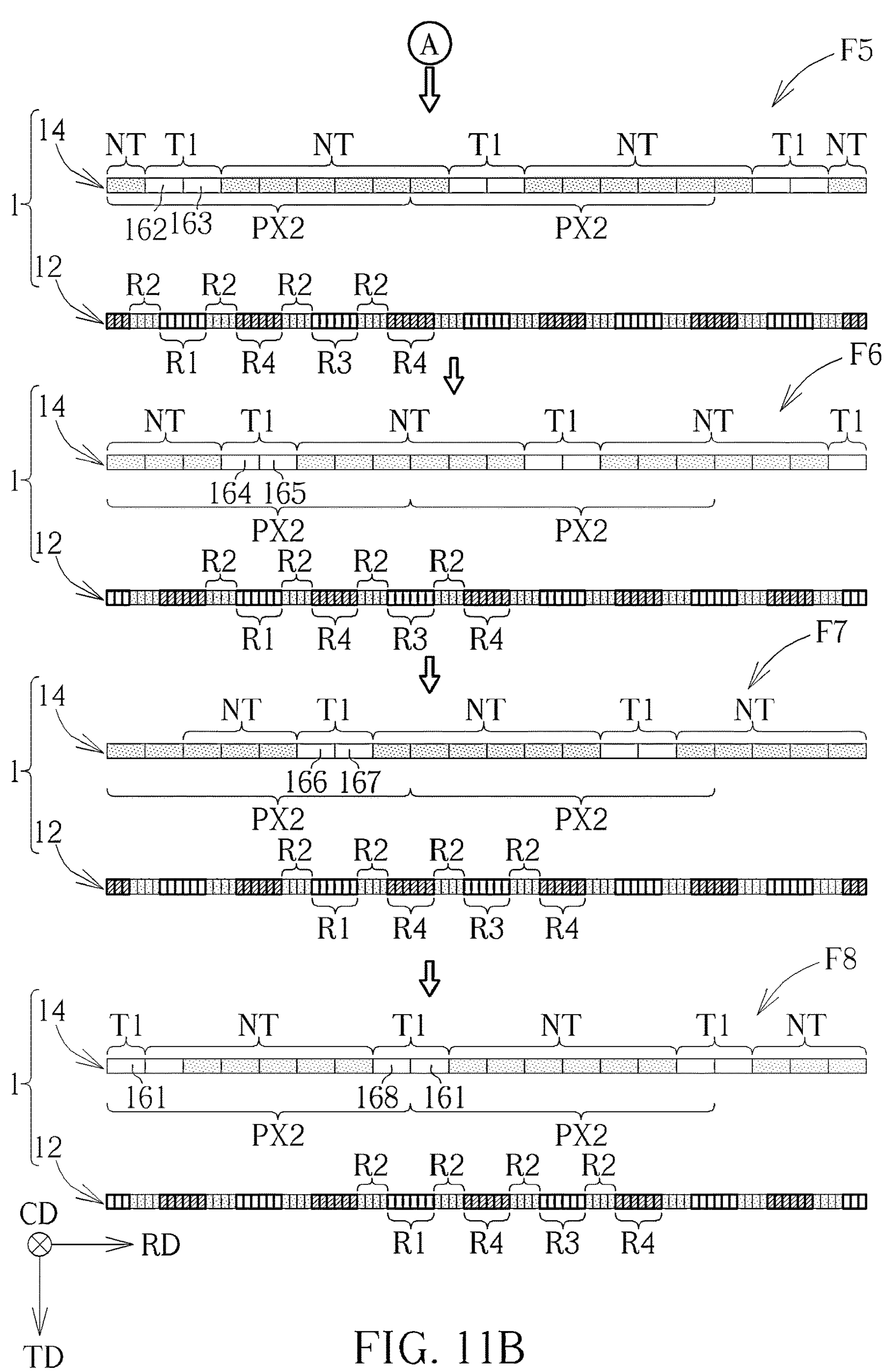

Refer to FIG. 11A and FIG. 11B. FIG. 11A and FIG. 11B schematically illustrate an operation method of an electronic device in the first displaying mode according to a seventh embodiment of the present disclosure. As shown in FIG. 11A and FIG. 11B, a difference between the operation method of this embodiment and the operation method in FIG. 7 is that one of the first transparent regions T1 formed by the light-adjustable control panel 14 may not be limited to be formed in sequence of the light control units 16 of the same group PX2, but may be formed in any sequence of the light control units 16 of the same group PX2 or the different groups PX2 in different frame times. In the embodiment of FIG. 11A and FIG. 11B, the number of the light control units 16 for forming single one of the first transparent regions T1 may be plural, for example, two. In some embodiments, one of the first transparent regions T1 may be formed by one of the light control units 16 in FIG. 11A and FIG. 11B.

Specifically, as shown in FIG. 11A, each of the groups PX2 may, for example, include the light control unit 161, the light control unit 162, the light control unit 163, the light control unit 164, a light control unit 165, a light control unit 166, a light control unit 167, and a light control unit 168 arranged in sequence. In the first frame time F1, the light control unit 167 and the light control unit 168 may form the first transparent region T1, and the light control unit 161, the light control unit 162, the light control unit 163, the light control unit 164, the light control unit 165, and the light control unit 166 may form the non-transparent region NT. Since the positions of the first display region R1, the second display region R3, the first light adjusting region R4, and the dark region R2 formed by the display 12 relative to the first transparent region T1 may be referred to the embodiment of FIG. 8, here will be no further elaborations. In the second frame time F2, the light control unit 161 and the light control unit 162 may form the first transparent region T1, and the light control unit 163, the light control unit 164, the light control unit 165, the light control unit 166, the light control unit 167, and the light control unit 168 may form the non-transparent region NT. Afterwards, in the third frame time F3, the light-adjustable control panel 14 switches the light control units forming the first transparent region T1 to the light control unit 163 and the light control unit 164. In the fourth frame time F4, the light-adjustable control panel 14 may use the light control unit 165 and the light control unit 166 to form the first transparent region T1.

As shown in FIG. 11B, a fifth frame time F5 may be continued after the fourth frame time F4 of FIG. 11A. In the fifth frame time F5, the light-adjustable control panel 14 uses the light control unit 162 and the light control unit 163 to form the first transparent region T1, but not the light control unit 167 and the light control unit 168. Afterwards, in a sixth frame time F6, the light-adjustable control panel 14 switches the light control units forming the first transparent region T1 to the light control unit 164 and the light control unit 165. Then, in a seventh frame time F7, the light-adjustable control panel 14 may use the light control unit 166 and the light control unit 167 to form the first transparent region T1. Next, in an eighth frame time F8, the light-adjustable control panel 14 may use the light control unit 161 and the light control unit 168 of two neighboring the groups PX2 that are adjacent to each other to form the first transparent region T1. After the eighth frame time F8, a procedure from the first frame time F1 to the eighth frame time F8 may be repetitively performed, or steps of the first frame time F1 to the eighth frame time F8 may be performed in any sequence, such that the position of the first transparent region T1 may change with different frame times to reduce a visibility of stripes. Other parts of the operation method of FIG. 11A and FIG. 11B may be similar or identical to the embodiment of FIG. 7. Hence, here will be no further elaborations.

Figure 12:
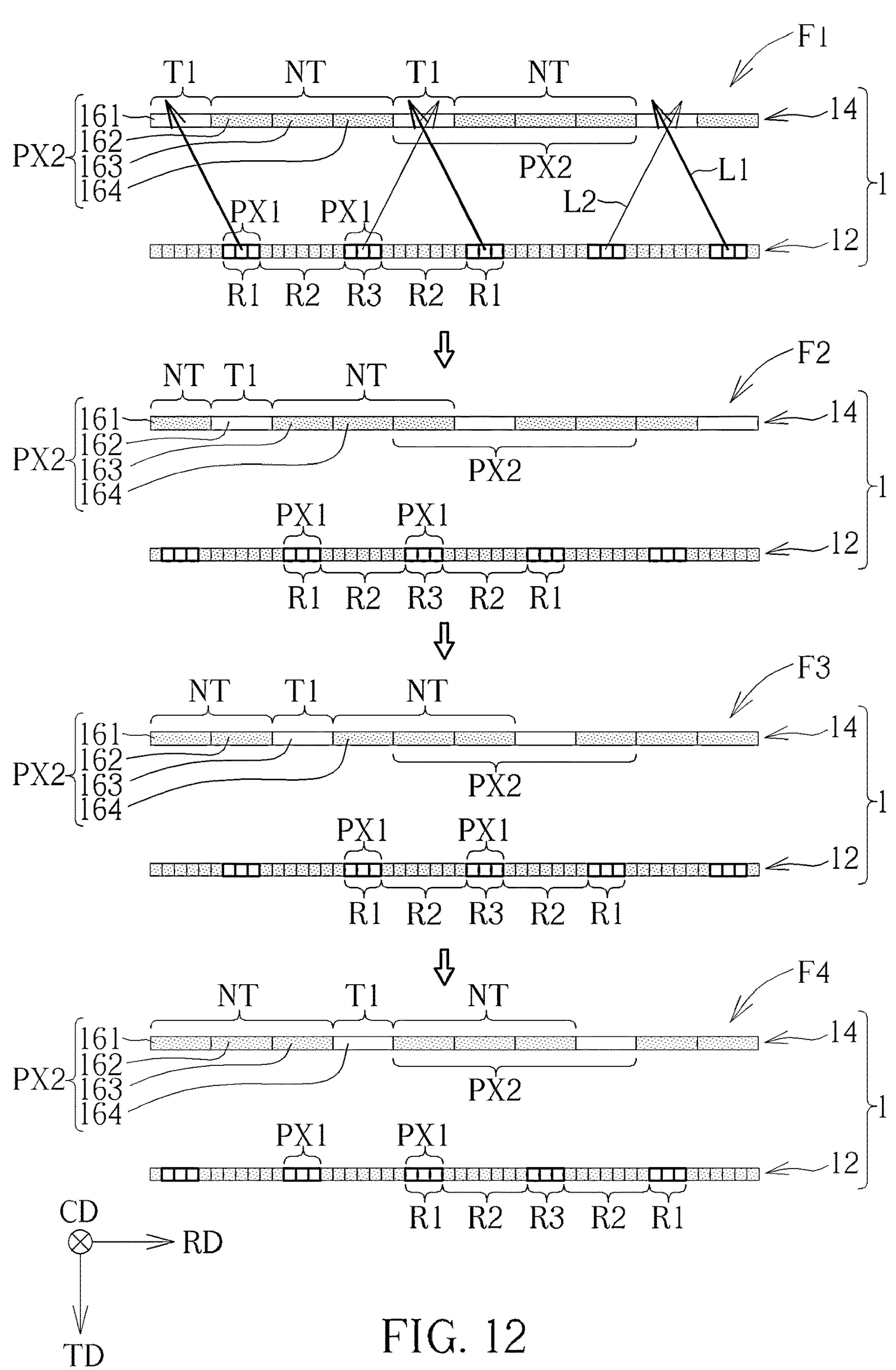
FIG. 12 schematically illustrates an operation method of an electronic device in a first displaying mode according to an eighth embodiment of the present disclosure.

Refer to FIG. 12. FIG. 12 schematically illustrates an operation method of an electronic device in the first displaying mode according to an eighth embodiment of the present disclosure. As shown in FIG. 12, a difference between the operation method of the electronic device 1 of this embodiment and the operation method of FIG. 7 is the first display region R1 and the second display region R3 of this embodiment both are not overlapped with the first transparent region T1 in the same frame time. Specifically, in the first frame time F1, the pixels PX1 of the display 12 may include the first display regions R1 and the second display regions R3, and may form the dark regions R2 between the first display regions R1 and the second display regions R3. In the meantime, in each of the groups PX2, the light control unit 161 may form the first transparent region T1, and the light control unit 162, the light control unit 163, and the light control unit 164 may form the non-transparent region NT. The first display regions R1 and the second display regions R3 are not overlapped with the first transparent regions T1, but are overlapped with the non-transparent regions NT. Viewing in the top view direction TD, one of the first display regions R1 and one of the second display regions R3 may be overlapped with a corresponding one of the non-transparent regions NT, wherein the first display region R1 is closer to the first transparent region T1 on the left side of the corresponding non-transparent region NT, and the second display region R3 is closer to the first transparent region T1 on the right side of the corresponding non-transparent region NT. In other words, the first transparent region T1 may be overlapped with one of the dark regions R2, and one of the first display regions R1 and one of the second display regions R3 may respectively be disposed on the right side and the left side of the same first transparent region T1. In the embodiment of FIG. 12, a distance between the first display region R1 and the first transparent region T1 may, for example, be identical to a distance between the second display region R3 and the same first transparent region T1. Under this circumstance, the light L1 generated by the first display regions R1 may be emitted out from the first transparent regions T1 towards a left side of the electronic device 1, which consequently may be seen by a user on the left side of the electronic device 1. The light L2 generated by the second display regions R3 may be emitted out from the first transparent region T1 towards a right side of the electronic device 1, which consequently may be seen by another user on the right side of the electronic device 1. In this way, the electronic device 1 may respectively display independent images to the users on different sides.

As shown in FIG. 12, the electronic device 1 may also synchronously change the positions of the first transparent regions T1 and the positions of the first display regions R1 and the second display regions R3 in sequence and in different frame times. To be specific, in the second frame time F2 after the first frame time F1, the light control unit 162 of the group PX2 may form the first transparent region T1, and the light control unit 161, the light control unit 163, and the light control unit 164 may form the non-transparent region NT. The pixels PX1 corresponding to the non-transparent region NT and disposed on the two sides of the first transparent region T1 when viewed along the top view direction TD may form the first display region R1 and the second display region R3, and the pixels PX1 disposed between the first display region R1 and the second display region R3 may form the dark region R2. Afterwards, in the third frame time F3, the light control unit 163 of the group PX2 may form the first transparent region T1, and the light control unit 161, the light control unit 162, and the light control unit 164 may form the non-transparent region NT. Also, the pixels PX1 corresponding to the non-transparent region NT and disposed on the two sides of the first transparent region T1 when viewed along the top view direction TD may form the first display region R1 and the second display region R3, and the pixels PX1 disposed between the first display region R1 and the second display region R3 may form the dark region R2. Next, in the fourth frame time F4, the light control unit 164 of the group PX2 may form the first transparent region T1, and the light control unit 161, the light control unit 162, and the light control unit 163 may form the non-transparent region NT. Also, the pixels PX1 corresponding to the non-transparent region NT and disposed on the two sides of the first transparent region T1 when viewed along the top view direction TD may form the first display region R1 and the second display region R3, and the pixels PX1 disposed between the first display region R1 and the second display region R3 may form the dark region R2. Since the relation of the positions of the first display region R1, the second display region R3, and the dark region R2 to the position of the first transparent region T1 from the second frame time F2 to the fourth frame time F4 may be identical to the relation in the first frame time F1, here will be no further elaborations. Other parts of the operation method of FIG. 12 may be similar or identical to the embodiment of FIG. 7. Hence, here will be no further elaborations.

Figure 13:
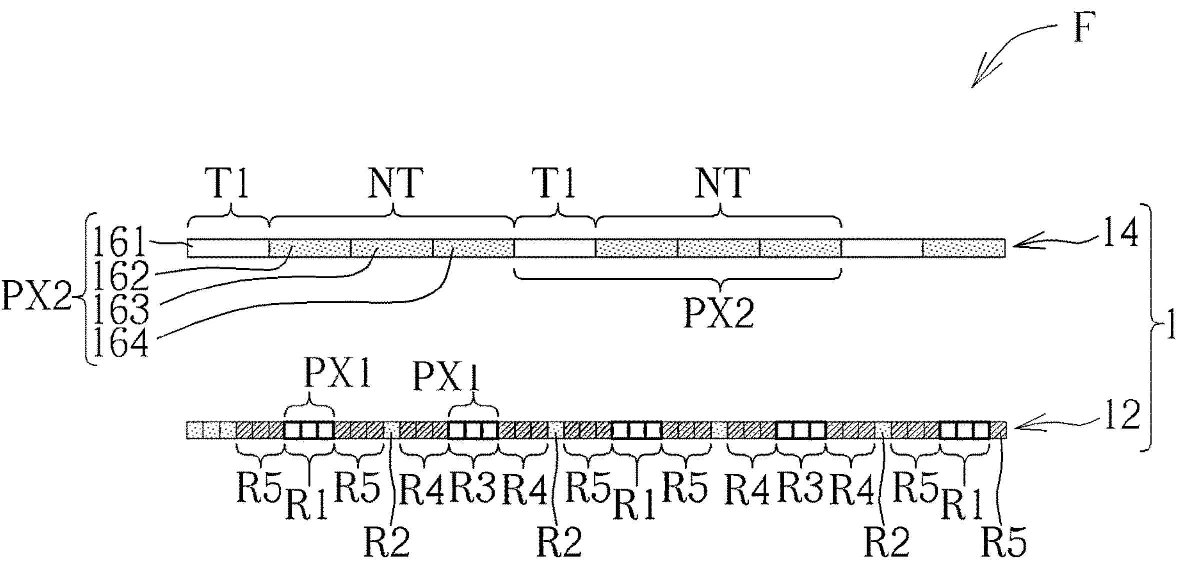
FIG. 13 schematically illustrates a cross-section view of an electronic device in a first displaying mode and in a frame time according to a ninth embodiment of the present disclosure.

Refer to FIG. 13. FIG. 13 schematically illustrates a cross-section view of an electronic device in the first displaying mode and in a frame time according to a ninth embodiment of the present disclosure. As shown in FIG. 13, a difference between the operation method of this embodiment and the operation method of FIG. 12 is the pixels PX1 of the display 12 may further respectively form or include the corresponding first light adjusting regions R4 on two sides of the second display region R3, and may further respectively form corresponding second light adjusting regions R5 on two sides of the first display region R1 in the frame time F, so as to reduce or prevent the content displayed by the first display region R1 and the second display region R3 from being seen by the non-user. In this embodiment, the brightness of the first light adjusting region R4 may be 0.2% to 10% of the brightness of the maximum gray scale value of all the pixels PX1 of the display 12 showing a white image (in the second displaying mode) minus 0.2% to 2.5% of the brightness of the content shown by the corresponding first display region R1. The brightness of the second light adjusting region R5 may be 0.2% to 10% of the brightness of the maximum gray scale value of all the pixels PX1 of the display 12 showing the white image (in the second displaying mode) minus 0.2% to 2.5% of the brightness of the content shown by the corresponding second display region R3. It is noted that, by the first light adjusting region R4 and the second light adjusting region R5 generating the above-mentioned brightness, the light of the first display region R1 leaked to a range of non-predetermined viewing angle through the first transparent region T1 (e.g., the light that is not emitted to the left side) may be neutralized by the light of the first light adjusting region R4, such that the non-user may not be easily or unable to see the image content displayed by the first transparent region T1. In the same way, the light of the second display region R3 leaked to another range of non-predetermined viewing angle (e.g., the light that is not emitted to the right side) may be neutralized by the light of the second light adjusting region R5, which enhances the anti-peeping effect.

In some embodiments, one of the first light adjusting regions R4 may be next to a corresponding one of the second display regions R3, and/or one of the second light adjusting regions R5 may be next to a corresponding one of the first display regions R1, but not limited thereto. In some embodiments, there may be at least one of the pixels PX1 disposed between the first light adjusting region R4 and the second light adjusting region R5, and the at least one pixel PX1 may form the dark region R2, but not limited thereto. In some embodiments, the pixels PX1 in FIG. 13 may adopt the operation method shown in FIG. 9, which does not form the dark regions R2, and the first light adjusting region R4 may be next to one of the second light adjusting regions R5, but not limited thereto. Other parts of the operation method of FIG. 13 may be similar or identical to the embodiment of FIG. 12. Hence, here will be no further elaborations.

In summary, in the electronic device of the present disclosure, the electronic device may be in the first displaying mode, such that the light-adjustable control panel may switch between the transparent state and the non-transparent state of different light control units to form the stripes with the transparent strips and the non-transparent strips alternately arranged. As the image of the display passes through the transparent strips, the image may display in the certain direction, such that the user in the certain position may see the image, and another person outside the certain position is difficult to see the image, which achieves the anti-peeping effect. The electronic device of the present disclosure may be in the second displaying mode, such that the image displayed by the display may all pass through the second transparent region and may be fully shown. Also, by switching the states of the light control units, the light-adjustable control panel may represent the first transparent regions and non-transparent regions with different numbers and arrangements, such that the image of the display may have different anti-peeping angles after passing through the light-adjustable control panel. Hence, the electronic device may switch displaying mode or adjust the anti-peeping angle for different needs in real time, which expands the applications of the display.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device able to switch between a first displaying mode and a second displaying mode, comprising:
- a display comprising a plurality of light emitting elements and a first substrate; and
- a light-adjustable control panel disposed on the display and comprising a plurality of light control units, and the light-adjustable control panel comprising:
- a second substrate;
- a third substrate disposed opposite to the second substrate; and
- a display medium sandwiched between the second substrate and the third substrate, wherein the plurality of light control units form a plurality of first transparent regions and a plurality of non-transparent regions alternately arranged through the display medium in the first displaying mode, and the plurality of light control units form a second transparent region through the display medium in the second displaying mode,
- wherein a ratio of a total area of the plurality of first transparent regions to a total area of the plurality of light control units is different from a ratio of an area of the second transparent region to the total area of the plurality of light control units,
- wherein the first substrate is disposed between the plurality of light emitting elements and the light-adjustable control panel, and
- wherein a ratio of a total width of one of the plurality of first transparent regions and one of the plurality of non-transparent regions to a distance between the display medium and one of the plurality of light emitting elements is greater than or equal to 0.5 and less than or equal to 2.

2. The electronic device according to claim 1, wherein the display comprises a plurality of pixels, and an angle between an extending direction of one of the plurality of light control units and a column direction of the plurality of pixels is greater than or equal to 5 degrees and less than or equal to 30 degrees.

3. The electronic device according to claim 1, wherein a ratio of an area of one of the plurality of first transparent regions to a total area of one of the plurality of first transparent regions and one of the plurality of non-transparent regions is greater than or equal to 14% and less than or equal to 50%.

4. The electronic device according to claim 1, wherein at least one of the plurality of light control units forms one of the plurality of first transparent regions, and at least another one of the plurality of light control units form one of the plurality of non-transparent regions.

5. The electronic device according to claim 1, further comprising a quarter wave plate disposed between the display and the light-adjustable control panel.

6. The electronic device according to claim 1, wherein the light-adjustable control panel further comprises a first polarizer and a second polarizer, the first polarizer is disposed on a surface of the second substrate away from the display medium, and the second polarizer is disposed on a surface of the third substrate away from the display medium.

7. The electronic device according to claim 1, wherein the display comprises a plurality of pixels, and a brightness of a maximum gray scale value of one of the plurality of pixels in the second displaying mode is in a range of 12% to 60% of a brightness of a maximum gray scale value of the one of the plurality of pixels in the first displaying mode.

8. The electronic device according to claim 1, wherein the display comprises a plurality of pixels, the plurality of pixels comprise a first display region and a second display region, the first display region is overlapped with one of the plurality of first transparent regions, and the second display region is not overlapped with one of the plurality of first transparent regions.

9. The electronic device according to claim 8, wherein the plurality of pixels further comprise a first light adjusting region disposed between the first display region and the second display region.

10. The electronic device according to claim 1, wherein the display comprises a plurality of pixels, the plurality of pixels comprise a first display region and a second display region, and the first display region and the second display region are not overlapped with the plurality of first transparent regions.

11. The electronic device according to claim 10, wherein the plurality of pixels further comprise two first light adjusting regions and two second light adjusting regions, the first light adjusting regions are disposed on two sides of the second display region, and the second light adjusting regions are disposed on two sides of the first display region.

12. The electronic device according to claim 10, wherein the plurality of pixels further comprises a dark region, and the dark region is overlapped with one of the plurality of first transparent regions.

13. The electronic device according to claim 1, wherein the display comprises a plurality of pixels, the plurality of pixels comprise a first display region and a dark region, the first display region is overlapped with one of the plurality of first transparent regions, and the dark region is overlapped with one of the plurality of non-transparent regions.

14. The electronic device according to claim 13, wherein the plurality of pixels further comprise two first light adjusting regions disposed on two sides of the first display region.

15. The electronic device according to claim 14, wherein a brightness of one of the first light adjusting regions complies with an equation: $B1=(M\times B2)-(N\times B3)$, where B1 is the brightness of the one of the first light adjusting regions, B2 is a brightness of a maximum gray scale value of the plurality of pixels of the display in the second displaying mode, B3 is a brightness of a content shown by the first display region, M is a first percentage in a range of 0.2% to 10%, and N is a second percentage in a range of 0.2% to 2.5%.

16. The electronic device according to claim 1, wherein the display comprises a plurality of pixels, and a width of one of the plurality of pixels is less than a width of one of the plurality of first transparent regions.

17. The electronic device according to claim 1, wherein the display comprises a plurality of pixels, and a width of one of the plurality of pixels is greater than a width of one of the plurality of first transparent regions.

18. The electronic device according to claim 1, wherein the display comprises a plurality of pixels, and each of the plurality of pixels has a pitch greater than or equal to 60 μm and less than or equal to 260 μm.

19. An electronic device able to switch between a first displaying mode and a second displaying mode, comprising:

a display comprising a plurality of pixels; and a light-adjustable control panel disposed on the display and comprising a plurality of light control units, and the light-adjustable control panel comprising:

a first substrate;

a second substrate disposed opposite to the first substrate; and a display medium sandwiched between the first substrate and the second substrate, wherein the plurality of light control units form a plurality of first transparent regions and a plurality of non-transparent regions alternately arranged through the display medium in the first displaying mode, and the plurality of light control units form a second transparent region through the display medium in the second displaying mode, wherein a ratio of a total area of the plurality of first transparent regions to a total area of the plurality of light control units is different from a ratio of an area of the second transparent region to the total area of the plurality of light control units, wherein a brightness of a maximum gray scale value of one of the plurality of pixels in the second displaying mode is in a range of 12% to 60% of a brightness of a maximum gray scale value of the one of the plurality of pixels in the first displaying mode.

20. The electronic device according to claim 19, wherein the plurality of pixels comprise a first display region and a second display region, the first display region is overlapped with one of the plurality of first transparent regions, and the second display region is not overlapped with one of the plurality of first transparent regions.

* * * * *